(12) United States Patent
Liang et al.

(10) Patent No.: US 9,633,985 B2
(45) Date of Patent: Apr. 25, 2017

(54) FIRST-ETCHED AND LATER-PACKAGED THREE-DIMENSIONAL SYSTEM-IN-PACKAGE NORMAL CHIP STACK PACKAGE STRUCTURE AND PROCESSING METHOD THEREOF

(71) Applicant: Jiangsu Changjiang Electronics Technology Co., Ltd., Jiangsu (CN)

(72) Inventors: Chih-Chung Liang, Jiangsu (CN); Yaqin Wang, Jiangsu (CN); Chunyan Zhang, Jiangsu (CN); Yu-Bin Lin, Jiangsu (CN); Youhai Zhang, Jiangsu (CN)

(73) Assignee: Jiangsu Changjiang Electronics Technology Co., Ltd, Jiangsu (CN)

( * ) Notice: Subject to any disclaimer, the term of this patent is extended or adjusted under 35 U.S.C. 154(b) by 0 days.

(21) Appl. No.: 14/901,483

(22) PCT Filed: Jan. 8, 2014

(86) PCT No.: PCT/CN2014/000020
§ 371 (c)(1),
(2) Date: Dec. 28, 2015

(87) PCT Pub. No.: WO2015/018174
PCT Pub. Date: Feb. 12, 2015

(65) Prior Publication Data
US 2016/0372450 A1 Dec. 22, 2016

(30) Foreign Application Priority Data
Aug. 6, 2013 (CN) .......................... 2013 1 0340538

(51) Int. Cl.
*H01L 21/00* (2006.01)
*H01L 25/00* (2006.01)
(Continued)

(52) U.S. Cl.
CPC .......... *H01L 25/50* (2013.01); *H01L 21/4825* (2013.01); *H01L 21/4828* (2013.01);
(Continued)

(58) Field of Classification Search
CPC .......... H01L 23/49575; H01L 21/4825; H01L 21/4853; H01L 21/00; H01L 23/495; H01L 23/498; H01L 21/48
(Continued)

(56) References Cited

U.S. PATENT DOCUMENTS 6,235,552 B1 * 5/2001 Kwon ................. H01L 23/3114
257/E21.508
6,270,263 B1 * 8/2001 Iwase ................... G02B 6/4292
385/14

(Continued)

FOREIGN PATENT DOCUMENTS

CN         1691314 A       11/2005
CN       102386104 A        3/2012

(Continued)

OTHER PUBLICATIONS

State Intellectual Property Office (P.R.C.), Chinese Office Action for Application No. 201310340538.2, mailed Aug. 21, 2015.

(Continued)

*Primary Examiner* — Caleb Henry
(74) *Attorney, Agent, or Firm* — Honigman Miller Schwartz and Cohn LLP; Matthew H. Szalach; Jonathan P. O'Brien

(57) ABSTRACT

A first-etched and later-packaged three-dimensional system-in-package normal chip stack package structure and a processing method for manufacturing the same are provided. The structure includes: a die pad (1); a lead (2); a chip (4) provided on a top surface of the die pad (1) by a conductive or non-conductive adhesive material (3); a metal wire (5) via
(Continued)

which a top surface of the chip (4) is connected to a top surface of the lead (2); a conductive pillar (6) provided on the surface of the lead (2); and a molding material (7).

10 Claims, 28 Drawing Sheets

(51) Int. Cl.
    H01L 25/065    (2006.01)
    H01L 23/495    (2006.01)
    H01L 21/48     (2006.01)
    H01L 21/56     (2006.01)
    H01L 23/31     (2006.01)

(52) U.S. Cl.
    CPC ...... H01L 21/4842 (2013.01); H01L 21/4889 (2013.01); H01L 21/565 (2013.01); H01L 23/3178 (2013.01); H01L 23/4952 (2013.01); H01L 23/49513 (2013.01); H01L 23/49575 (2013.01); H01L 25/0657 (2013.01); H01L 2225/0651 (2013.01); H01L 2225/06517 (2013.01); H01L 2225/06541 (2013.01); H01L 2225/06582 (2013.01)

(58) Field of Classification Search
    USPC .......................................... 438/123
    See application file for complete search history.

(56) References Cited

U.S. PATENT DOCUMENTS

| | | | | |
|---|---|---|---|---|
| 6,306,682 | B1* | 10/2001 | Huang | H01L 21/56 257/E21.502 |
| 6,498,099 | B1* | 12/2002 | McLellan | H01L 21/4832 257/E23.043 |
| 6,559,540 | B2* | 5/2003 | Kawashima | H01L 23/3171 257/737 |
| 6,686,652 | B1* | 2/2004 | Bayan | H01L 21/4842 257/678 |
| 6,956,283 | B1* | 10/2005 | Peterson | B81B 7/0025 257/680 |
| 6,987,031 | B2* | 1/2006 | Eng | H01L 21/4857 257/E21.705 |
| 7,145,225 | B2* | 12/2006 | Lee | H01L 23/3677 257/684 |
| 7,667,325 | B2 | 2/2010 | Jo et al. | |
| 7,816,187 | B2* | 10/2010 | Huang | H01L 21/4832 257/690 |
| 8,063,470 | B1* | 11/2011 | Sirinorakul | H01L 21/4832 257/666 |
| 8,735,224 | B2* | 5/2014 | Do | H01L 21/4832 257/676 |
| 9,281,258 | B1* | 3/2016 | Fon | H01L 23/3121 |
| 2004/0195664 | A1* | 10/2004 | Chiu | G06K 9/00053 257/676 |
| 2004/0259289 | A1* | 12/2004 | Hubbard | H01L 23/4985 438/108 |
| 2005/0006737 | A1 | 1/2005 | Islam et al. | |
| 2005/0200007 | A1* | 9/2005 | Liu | H01L 23/50 257/724 |
| 2006/0079027 | A1* | 4/2006 | Yamada | H01L 21/4857 438/121 |
| 2007/0122940 | A1 | 5/2007 | Gautham | |
| 2007/0126112 | A1* | 6/2007 | Cho | H05K 1/056 257/700 |
| 2007/0141756 | A1* | 6/2007 | Iitani | H01L 21/4821 438/123 |
| 2008/0289866 | A1* | 11/2008 | Yuri | H01L 23/49822 174/260 |
| 2009/0004784 | A1* | 1/2009 | Huang | H01L 21/4832 438/124 |
| 2010/0052146 | A1* | 3/2010 | Jiang | H01L 21/561 257/690 |
| 2010/0258921 | A1* | 10/2010 | Chang Chien | H01L 21/4832 257/676 |
| 2011/0057298 | A1* | 3/2011 | Ramos | H01L 24/36 257/667 |
| 2011/0115069 | A1* | 5/2011 | Teh | H01L 21/486 257/693 |
| 2011/0163433 | A1* | 7/2011 | Toda | H01L 21/4828 257/676 |
| 2011/0180935 | A1 | 7/2011 | Choi et al. | |
| 2012/0018867 | A1* | 1/2012 | Toda | H01L 21/4828 257/676 |
| 2012/0038036 | A1* | 2/2012 | Chun | H01L 21/4832 257/677 |
| 2016/0141233 | A1* | 5/2016 | Liang | H01L 23/49575 257/676 |
| 2016/0148861 | A1* | 5/2016 | Liang | H01L 23/49517 257/676 |
| 2016/0163622 | A1* | 6/2016 | Liang | H01L 23/3128 257/676 |

FOREIGN PATENT DOCUMENTS

| | | |
|---|---|---|
| CN | 102723284 A | 10/2012 |
| CN | 102723293 A | 10/2012 |
| CN | 103456645 A | 12/2013 |
| JP | 2000328264 A | 11/2000 |
| KR | 100723529 B1 | 5/2007 |
| WO | WO-2015018174 A1 | 2/2015 |

OTHER PUBLICATIONS

International Searching Authority, International Search Report and Written Opinion for International Application No. PCT/CN2014/000020, mailed May 16, 2014.

* cited by examiner

FIRST-ETCHED AND LATER-PACKAGED THREE-DIMENSIONAL SYSTEM-IN-PACKAGE NORMAL CHIP STACK PACKAGE STRUCTURE AND PROCESSING METHOD THEREOF

CROSS-REFERENCE TO RELATED APPLICATIONS

This application is a national phase of International Application No. PCT/CN2014/000020, titled "FIRST-ETCHED AND LATER-PACKAGED THREE-DIMENSIONAL SYSTEM-IN-PACKAGE NORMAL CHIP STACK PACKAGE STRUCTURE AND PROCESSING METHOD THEREOF", filed on Jan. 8, 2014, which claims the priority of Chinese Patent Application No. 201310340538.2, entitled "FIRST-ETCHED AND LATER-PACKAGED THREE-DIMENSIONAL SYSTEM-IN-PACKAGE NORMAL CHIP STACK PACKAGE STRUCTURE AND PROCESSING METHOD THEREFOF", filed with the Chinese Patent Office on Aug. 6, 2013, the disclosures of which are incorporated by reference in their entirety herein.

FIELD

The present disclosure relates to a first-etched and later-packaged three-dimensional system-in-package normal chip stack package structure and a processing method thereof, which belongs to a technical field of semiconductor packaging.

BACKGROUND

In a conventional PoP (Package on Package) package stack structure, a bottom logic device substrate package is stacked with a top memory device substrate package. Stacking and electrically connecting two packages are achieved by performing attaching and reflowing of a solder ball between the bottom package and the top package, as shown in FIG. 81.

SUMMARY

A method for manufacturing a first-etched and later-packaged three-dimensional system-in-package normal chip stack package is provided, which includes the following steps:

step 1, providing a metal substrate;

step 2, pre-plating a surface of the metal substrate with a micro copper layer;

step 3, applying a photoresist film, wherein a top surface and a bottom surface of the metal substrate which have been pre-plated with the micro copper layer are respectively applied with the photoresist film which can be exposed and developed;

step 4, removing a part of the photoresist film on the bottom surface of the metal substrate, wherein the bottom surface of the metal substrate, which has been applied with the photoresist film in step 3, is exposed and developed with a pattern using an exposure and development equipment, and the part of the photoresist film in the pattern is removed, so as to expose a region of the bottom surface of the metal substrate to be plated later;

step 5, plating with a metal wiring layer, wherein the region of the bottom surface of the metal substrate from which the part of the photoresist film has been removed in step 4 is plated with the metal wiring layer;

step 6, applying a photoresist film, wherein the bottom surface of the metal substrate in step 5 is applied with the photoresist film which can be exposed and developed;

step 7, removing a part of the photoresist film on the bottom surface of the metal substrate, wherein the bottom surface of the metal substrate, which has been applied with the photoresist film in step 6, is exposed and developed with a pattern using an exposure and development equipment, and the part of the photoresist film in the pattern is removed, so as to expose a region of the bottom surface of the metal substrate to be plated later;

step 8, plating with a high conductivity metal wiring layer, wherein the region of the bottom surface of the metal substrate from which the part of the photoresist film has been removed in step 7 is plated with the high conductivity metal wiring layer, so that a die pad and a lead are formed;

step 9, removing the photoresist film, wherein the photoresist film on the surface of the metal substrate is removed;

step 10, molding with epoxy resin, wherein the molding with the epoxy resin for protecting is performed on a surface of the metal wiring layer provided on the bottom surface of the metal substrate;

step 11, grinding a surface of the epoxy resin, wherein the surface of the epoxy resin is ground after the molding with the epoxy resin has been performed;

step 12, applying a photoresist film, wherein the top surface and the bottom surface of the metal substrate are applied with the photoresist film adapted to expose and develop after the surface of the epoxy resin has been ground in step 11;

step 13, removing a part of the photoresist film on the top surface of the metal substrate, wherein the top surface of the metal substrate, which has been applied with the photoresist film in step 12, is exposed and developed with a pattern using an exposure and development equipment, and the part of the photoresist film in the pattern is removed, so as to expose a region of the top surface of the metal substrate to be etched later;

step 14, chemical etching;

wherein the chemical etching is performed in the region of the top surface of the metal substrate in which exposing and developing have been performed in step 13;

step 15, applying a photoresist film, wherein the top surface and the bottom surface of the metal substrate on which step 14 has been performed are applied with the photoresist film adapted to expose and develop;

step 16, removing a part of the photoresist film on the top surface of the metal substrate, wherein the top surface of the metal substrate, which has been applied with the photoresist film in step 15, is exposed and developed with a pattern using an exposure and development equipment, and the part of the photoresist film in the pattern is removed, so as to expose a region of the top surface of the metal substrate to be plated later;

step 17, plating with a metal pillar,
  wherein the region of the top surface of the metal substrate from which the part of the photoresist film has been removed in step 16 is plated with the metal pillar;
step 18, removing the photoresist film,
  wherein the photoresist film on the surface of the metal substrate is removed;
step 19, coating with an adhesive material;
  wherein a top surface of the die pad formed in step 8 is coated with a conductive or non-conductive adhesive material;
step 20, bonding dies,
  wherein a chip is bonded in the conductive or non-conductive adhesive material in step 19;
step 21, bonding a metal wire,
  wherein the metal wire is bonded between a top surface of the chip and a top surface of the lead;
step 22, encapsulating,
  wherein the molding with a molding material is performed on the top surface of the metal substrate in step 21;
step 23, grinding a surface of an epoxy resin,
  wherein the surface of the epoxy resin is ground after the molding with the epoxy resin has been performed in step 22;
step 24, plating with an anti-oxidizing metal layer or coating with an organic solderability preservative (OSP),
  wherein an exposed surface of the metal substrate is plated with the anti-oxidizing metal layer or is coated with the organic solderability preservative (OSP) after step 23;
step 25, stacking with a package,
  wherein a top of the metal pillar or a bottom surface of the lead is stacked with the package after the plating with the anti-oxidizing metal layer or the coating with the organic solderability preservative has been performed in step 24;
step 26, package sawing to form a finished product,
  wherein a semi-finished product is package sawed after the stacking with the package has been performed in step 25 to form a first-etched and later-packaged three-dimensional system-in-package normal chip stack package structure.

A first-etched and later-packaged three-dimensional system-in-package normal chip stack package structure is provided, which includes: a die pad; a lead; a chip is provided in both conductive and non-conductive adhesive material on a top surface of the die pad; a metal wire is used to connect a top surface of the chip to a top surface of the lead; a conductive pillar provided on the top surface of the lead; a peripheral region of the die pad, a region between the die pad and a lead, a region between the leads, an upper region of the die pad and a lead, a lower region of the die pad and a lead and the chip, the metal wire, and the conductive pillar are encapsulated with a molding material, with the molding material being flush with a top of the conductive pillar, and a surface of the lead and the conductive pillar exposed from the molding material being plated with an anti-oxidizing layer or being coated with an organic solderability preservative; and a package is provided on the top of the conductive pillar or on a bottom surface of the lead via a conductive material.

A first-etched and later-packaged three-dimensional system-in-package normal chip stack package structure is provided, which includes: a die pad; a lead; a chip is provided in both conductive and non-conductive adhesive material on a top surface of the die pad; a metal wire is used to connect a top surface of the chip to a top surface of the lead; a conductive pillar provided on the top surface of the lead; a peripheral region of the die pad, a region between the die pad and a lead, a region between the leads, an upper region of the die pad and a lead, a lower region of the die pad and a lead and the chip, the metal wire, and the conductive pillar are encapsulated with a molding material, with the molding material being flush with a top of the conductive pillar, and a surface of the lead and the conductive pillar exposed from the plastic package being plated with an anti-oxidizing layer or being coated with an organic solderability preservative; and a package is provided on the top of the conductive pillar or on a bottom surface of the lead via a first metal ball.

Alternatively, an outer lead of the package may be a flat lead, and a conductive material is provided between the flat lead and the conductive pillar or between the flat lead and the bottom surface of the lead.

Alternatively, an outer lead of the package may be an L-shaped outer lead, and a conductive material is provided between the L-shaped outer lead and the conductive pillar or between the L-shaped outer lead and the bottom surface of the lead.

Alternatively, an outer lead of the package may be a J-shaped outer lead, and a conductive material is provided between the J-shaped outer lead and the conductive pillar or between the J-shaped outer lead and the bottom surface of the lead.

Alternatively, a second metal ball may be provided on the top of the conductive pillar or on the bottom surface of the lead.

Alternatively, the package may include a lead frame structure and a package structure, with the package structure is stacked on the lead frame structure.

A method for manufacturing a first-etched and later-packaged three-dimensional system-in-package normal chip stack package is provided, which includes the following steps:
  step 1, providing a metal substrate;
  step 2, pre-plating a surface of the metal substrate with a micro copper layer;
  step 3, applying a photoresist film,
    wherein a top surface and a bottom surface of the metal substrate which have been pre-plated with the micro copper layer are respectively applied with the photoresist film which can be exposed and developed;
  step 4, removing a part of the photoresist film on the bottom surface of the metal substrate,
    wherein the bottom surface of the metal substrate, which has been applied with the photoresist film in step 3, is exposed and developed with a pattern using an exposure and development equipment, and the part of the photoresist film in the pattern is removed, so as to expose a region of the bottom surface of the metal substrate to be plated later;
  step 5, plating with a first metal wiring layer,
    wherein the region of the bottom surface of the metal substrate from which the part of the photoresist film has been removed in step 4 is plated with the first metal wiring layer;
  step 6, applying a photoresist film,
    wherein the bottom surface of the metal substrate in step 5 is applied with the photoresist film which can be exposed and developed;

step 7, removing a part of the photoresist film on the bottom surface of the metal substrate,
wherein the bottom surface of the metal substrate, which has been applied with the photoresist film in step 6, is exposed and developed with a pattern using an exposure and development equipment, and the part of the photoresist film in the pattern is removed, so as to expose a region of the bottom surface of the metal substrate to be plated later;

step 8, plating with a second metal wiring layer,
wherein the region of the bottom surface of the metal substrate from which the part of the photoresist film has been removed in step 7 is plated with the second metal wiring layer, which serves as a conductive pillar to connect the first metal wiring layer to a third metal wiring layer;

step 9, removing the photoresist film,
wherein the photoresist film on the surface of the metal substrate is removed;

step 10, applying a non-conductive adhesive film,
wherein the bottom surface of the metal substrate is applied with a layer of the non-conductive adhesive film;

step 11, grinding a surface of the non-conductive adhesive film,
wherein the surface of the non-conductive adhesive film is ground after the applying the non-conductive adhesive film has been performed;

step 12, performing metallization pretreatment on the surface of the non-conductive adhesive film,
wherein the metallization pretreatment is performed on the surface of the non-conductive adhesive film;

step 13, applying a photoresist film,
wherein the top surface and the bottom surface of the metal substrate in step 12 are applied with the photoresist film which can be exposed and developed;

step 14, removing a part of the photoresist film on the bottom surface of the metal substrate,
wherein the bottom surface of the metal substrate, which has been applied with the photoresist film in step 13, is exposed and developed with a pattern using an exposure and development equipment, and the part of the photoresist film in the pattern is removed, so as to expose a region of the bottom surface of the metal substrate to be etched later;

step 15, etching;
wherein the etching is performed in a region in which the part of the photoresist film has been removed in step 14;

step 16, removing the photoresist film on the bottom surface of the metal substrate,
wherein the photoresist film on the bottom surface of the metal substrate is removed, so as to expose a metal region to be plated later;

step 17, plating with a third metal wiring layer,
wherein the bottom surface of the metal substrate in step 16 is plated with the third metal wiring layer;

step 18, applying a photoresist film,
wherein the bottom surface of the metal substrate in step 17 is applied with the photoresist film which can be exposed and developed;

step 19, removing a part of the photoresist film on the bottom surface of the metal substrate,
wherein the bottom surface of the metal substrate, which has been applied with the photoresist film in step 18, is exposed and developed with a pattern using an exposure and development equipment, and the part of the photoresist film in the pattern is removed, so as to expose a region of the bottom surface of the metal substrate to be plated later;

step 20, plating with a fourth metal wiring layer,
wherein the region of the bottom surface of the metal substrate from which the part of the photoresist film has been removed in step 19 is plated with the fourth metal wiring layer, which serves as a conductive pillar to connect the third metal wiring layer to a fifth metal wiring layer;

step 21, removing the photoresist film,
wherein the photoresist film on the surface of the metal substrate is removed;

step 22, applying a non-conductive adhesive film,
wherein the bottom surface of the metal substrate is applied with a layer of the non-conductive adhesive film;

step 23, grinding a surface of the non-conductive adhesive film,
wherein the surface of the non-conductive adhesive film is ground after the applying the non-conductive adhesive film has been performed;

step 24, performing metallization pretreatment on the surface of the non-conductive adhesive film,
wherein the metallization pretreatment is performed on the surface of the non-conductive adhesive film;

step 25, applying a photoresist film,
wherein the top surface and the bottom surface of the metal substrate in step 24 are applied with the photoresist film adapted to expose and develop;

step 26, removing a part of the photoresist film on the bottom surface of the metal substrate,
wherein the bottom surface of the metal substrate, which has been applied with the photoresist film in step 25, is exposed and developed with a pattern using an exposure and development equipment, and the part of the photoresist film in the pattern is removed, so as to expose a region of the bottom surface of the metal substrate to be etched later;

step 27, etching;
wherein the etching is performed in a region in which the part of the photoresist film has been removed in step 26;

step 28, removing the photoresist film on the bottom surface of the metal substrate,
wherein the photoresist film on the bottom surface of the metal substrate is removed;

step 29, plating with a fifth metal wiring layer,
wherein the bottom surface of the metal substrate in step 28 is plated with the fifth metal wiring layer, so that a die pad and a lead are formed on the metal substrate;

step 30, applying a non-conductive adhesive film,
wherein the bottom surface of the metal substrate is applied with a layer of the non-conductive adhesive film;

step 31, grinding a surface of the non-conductive adhesive film,
wherein the surface of the non-conductive adhesive film is ground after the applying the non-conductive adhesive film has been performed, so as to expose a surface of the fifth metal wiring layer;

step 32, applying a photoresist film,
wherein the top surface the metal substrate in step 31 is applied with the photoresist film which can be exposed and developed;

step 33, removing a part of the photoresist film on the top surface of the metal substrate,
wherein the top surface of the metal substrate, which has been applied with the photoresist film in step 32, is exposed and developed with a pattern using an exposure and development equipment, and the part of the photoresist film in the pattern is removed, so as to expose a region of the top surface of the metal substrate to be etched later;

step 34, chemical etching;

wherein the chemical etching is performed in a region on the top surface of the metal substrate in which exposing and developing have been performed in step 33, till the metal wiring layer is reached;

step 35, applying a photoresist film, wherein the top surface of the metal substrate on which the chemical etching has been performed in step 34 is applied with the photoresist film which can be exposed and developed;

step 36, removing a part of the photoresist film on the top surface of the metal substrate, wherein the top surface of the metal substrate, which has been applied with the photoresist film in step 35, is exposed and developed with a pattern using an exposure and development equipment, and the part of the photoresist film in the pattern is removed, so as to expose a region of the top surface of the metal substrate to be plated later;

step 37, plating with a metal pillar, wherein the region of the top surface of the metal substrate from which the part of the photoresist film has been removed in step 36 is plated with the metal pillar;

step 38, removing the photoresist film, wherein the photoresist film on the surface of the metal substrate is removed;

step 39, coating with an adhesive material;

wherein a top surface of the die pad is coated with a conductive or non-conductive adhesive material after the photoresist film on the surface of the metal substrate has been removed in step 38;

step 40, bonding dies, wherein a chip is bonded in the conductive or non-conductive adhesive material in step 39;

step 41, bonding a metal wire, wherein the metal wire is bonded between a top surface of the chip and a top surface of the lead;

step 42, encapsulating, wherein the molding with epoxy resin, which is commonly known as a molding material, is performed on the top surface of the metal substrate in step 41;

step 43, grinding a surface of the epoxy resin, wherein the surface of the epoxy resin is ground after the molding with the epoxy resin has been performed in step 42;

step 44, plating with an anti-oxidizing metal layer or coating with an organic solderability preservative (OSP), wherein an exposed surface of the metal substrate is plated with the anti-oxidizing metal layer or is coated with the organic solderability preservative (OSP) after the surface of the epoxy resin has been ground in step 43;

step 45, stacking with a package, wherein the package is provided on a top of the metal pillar or a bottom surface of the lead after the plating with the anti-oxidizing metal layer or the coating with the organic solderability preservative has been performed in step 44;

step 46, package sawing to form a finished product, wherein a semi-finished product is package sawed after the stacking of the package has been performed in step 45 to form a first-etched and later-packaged three-dimensional system-in-package normal chip stack package structure.

Alternatively, step 6 to step 17 may be repeated for times to form more metal wiring layers.

As compared with the prior art, the present disclosure has the following beneficial effects.

1. As for the three-dimensional metal wiring composite-type substrate stack package in the present disclosure, an object can be embedded into interlayer of the three-dimensional metal wiring composite-type substrate, thereby the three-dimensional system-in-package metal wiring substrate can be stacked with a package directly, so that a POP (package on package) system-in-package function integrated package can be achieved.
2. The three-dimensional system-in-package metal wiring composite-type substrate is connected to the package via a conductive pillar located on the substrate or a RDL (re-distribution layer) wiring node. While, the conductive pillar or the RDL (re-distribution layer) wiring node are all exposed from a molding surface of the substrate, thereby between the three-dimensional system-in-package metal wiring substrate and the top package, any package-type device including a passive assembly can be stacked directly, such as a resistor, a capacitor and an inductor, no metal ball is needed to be bonded.
3. Since the conductive pillar or the RDL (re-distribution layer) wiring node of the three-dimensional system-level metal wiring substrate are all exposed from a molding surface of the substrate, the thickness of the substrate is not limited by the height of a connection node, and multiple-layer chips or passive assemblies can be stacked or embedded inside the substrate as required.
4. Since the conductive pillar or the RDL (re-distribution layer) wiring node of the three-dimensional system-in-package metal wiring substrate are all exposed from a molding surface of the substrate, an outer lead of the top package can be connected to the conductive pillar via a small metal ball, as shown in FIG. 85.
5. Since the three-dimensional system-in-package metal wiring substrate is connected to the package via the conductive pillar located on the substrate, no thermal deformation occurs in the conductive pillar before and after reflowing, and it is not necessary to increase the pitch between the conductive pillars to prevent the conductive pillars from occurring of a short circuit after reflowing, and thereby stacking of the package with fine pitch is facilitated.

Figure 1:
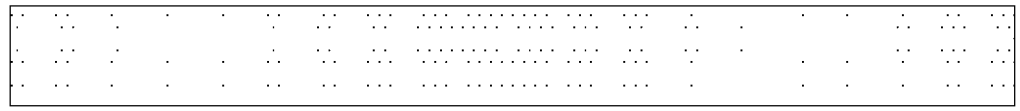
FIG. 1 to FIG. 26 are respectively schematic procedure diagrams of a method for manufacturing a first-etched and later-packaged three-dimensional system-in-package normal chip stack package according to a first embodiment of the present disclosure.

die pad 1
lead 2
conductive or non-conductive adhesive material 3
chip 4
metal wire 5
conductive pillar 6
molding material 7
anti-oxidizing layer or organic solderability preservative 8
package 9
conductive material 10
flat lead 11
J-shaped lead 12
L-shaped lead 13
first metal ball 14
second metal ball 15
lead frame structure 16
package structure 17
non-conductive adhesive film 18

DETAILED DESCRIPTION

A first-etched and later-packaged three-dimensional system-in-package normal chip stack package structure and a processing method thereof are provided in the present disclosure.

First Embodiment

Single-Layer Wiring, Single Normal Chip, and Lap Lead

Figure 27:
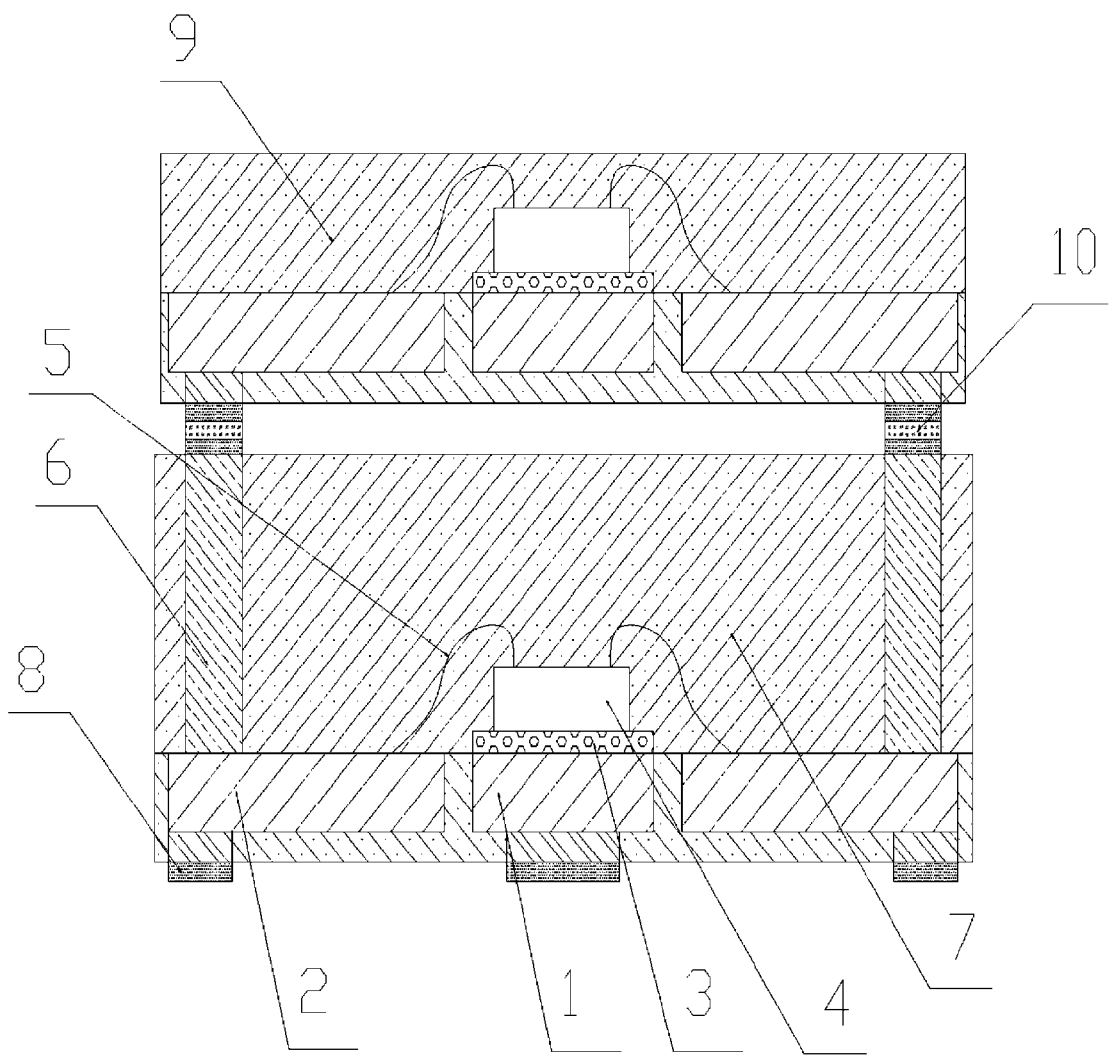
FIG. 27 is a schematic diagram of a first-etched and later-packaged three-dimensional system-in-package normal chip stack package structure according to the first embodiment of the present disclosure.

Referring to FIG. 27, which is a schematic diagram of a first-etched and later-packaged three-dimensional system-in-package normal chip stack package structure according to a first embodiment of the present disclosure, and the structure includes: a die pad 1; a lead 2; a chip 4 provided on a top surface of the die pad 1 by a conductive or non-conductive adhesive material 3; a metal wire 5 via which a top surface of the chip 4 is connected to a top surface of the lead 2; a conductive pillar 6 provided on the top surface of the lead 2; a peripheral region of the die pad 1, a region between the die pad 1 and a lead 2, and between the leads 2, an upper region of the die pad 1 and a lead 2, a lower region of the die pad 1 and a lead 2, the chip 4, the metal wire 5, and the conductive pillar 6 are all encapsulated a molding material 7, with the molding material 7 being flush with a top of the conductive pillar 6, and a surface of the die pad 1, the lead 2 and the conductive pillar 6 exposed from the molding material 7 being plated with an anti-oxidizing layer (8) or being coated with an organic solderability preservative (OSP) 8; a package 9 is provided on the top of the conductive pillar 6 or on a bottom surface of the lead 2, with an outer lead of the package 9 being a flat lead 11; and a conductive material 10 provided between the flat lead 11 and the conductive pillar 6 or between the flat lead 11 and the lead 2.

A processing method thereof includes steps 1 to 26.

Step 1, providing a metal substrate.

Referring to FIG. 1, the metal substrate having a suitable thickness is provided, which is used as a transitional material for supporting a wiring layer structure during wiring manufacturing and packaging later. The substrate is mainly made from a metal material which may be copper material, iron material, galvanized material, stainless steel, aluminum material, or metallic or non-metallic material which can have a conductive function.

Step 2, pre-plating a surface of the metal substrate with a micro copper layer.

Figure 2:
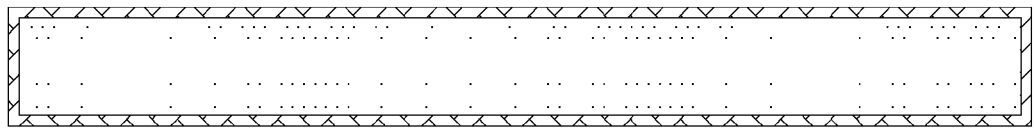

Referring to FIG. 2, the surface of the metal substrate is pre-plated with a micro copper layer. The micro copper layer has a thickness of 2 μm to 10 μm, which can also be thinned or thickened depending on the function requirement, so that a wiring layer can be bonded to the metal substrate tightly during the wiring manufacturing later. And the plating may be chemical deposition or electrolytic plating.

Step 3, applying a photoresist film.

Figure 3:
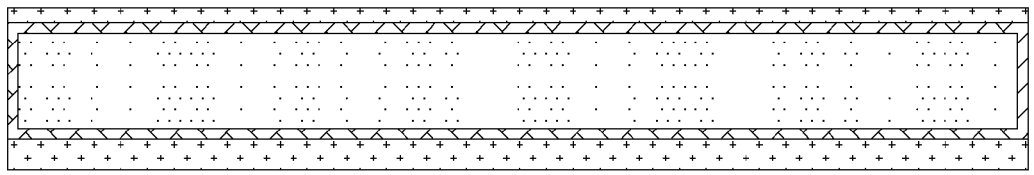

Referring to FIG. 3, a top surface and a bottom surface of the metal substrate which have been pre-plated with the micro copper layer are respectively applied with the photoresist film which can be exposed and developed, so as to protect the implementation of plating with a metal layer later. The photoresist film may be a dry photoresist film or a wet photoresist film.

Step 4, removing a part of the photoresist film on the bottom surface of the metal substrate.

Figure 4:
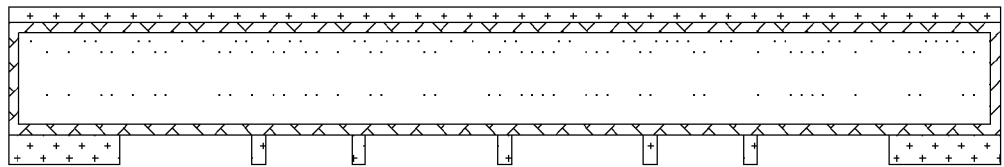

Referring to FIG. 4, the bottom surface of the metal substrate, which has been applied with the photoresist film in step 3, is exposed and developed with a pattern using an exposure and development equipment, and the part of the photoresist film in the pattern is removed, so as to expose a region of the bottom surface of the metal substrate to be plated later.

Step 5, plating with the metal wiring layer.

Figure 5:
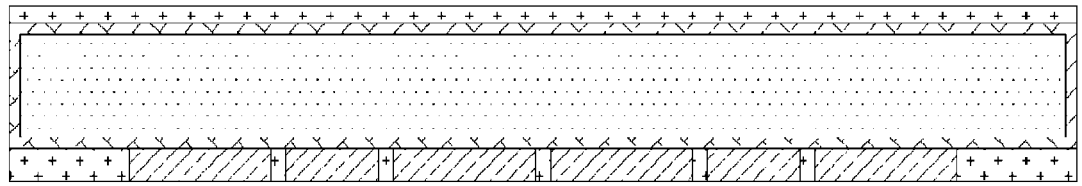

Referring to FIG. 5, the region of the bottom surface of the metal substrate from which the part of the photoresist film has been removed in step 4 is plated with the metal wiring layer. The metal wiring layer may be made from copper, aluminum, nickel, silver, gold, copper-silver, nickel-gold, nickel-palladium-gold or the like. In practice, other metallic materials which can have a conductive function may be used, which are not limited thereto. The metal wiring layer commonly has a thickness of 5 μm to 20 μm, and the plated thickness can be changed depending on the different characteristic. And the plating may be chemical deposition or electrolytic plating.

Step 6, applying a photoresist film.

Figure 6:
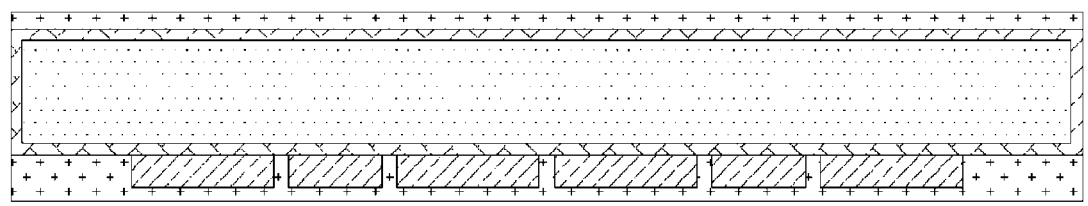

Referring to FIG. 6, the bottom surface of the metal substrate in step 5 is applied with the photoresist film which can be exposed and developed. The photoresist film may be a dry photoresist film or a wet photoresist film.

Step 7, removing a part of the photoresist film on the bottom surface of the metal substrate.

Figure 7:
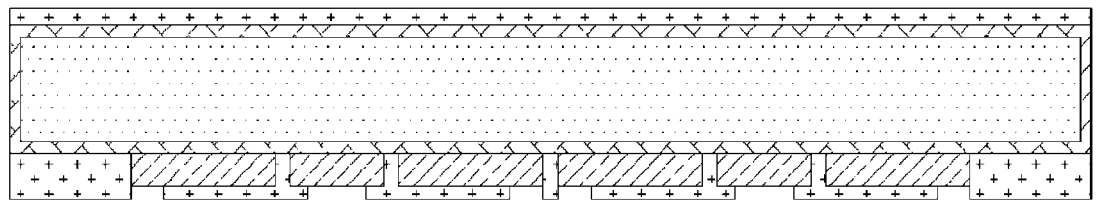

Referring to FIG. 7, the bottom surface of the metal substrate, which has been applied with the photoresist film in step 6, is exposed and developed with a pattern using an exposure and development equipment, and the part of the photoresist film in the pattern is removed, so as to expose a region of the bottom surface of the metal substrate to be plated later.

Step 8, plating with a high conductivity metal wiring layer.

Figure 8:
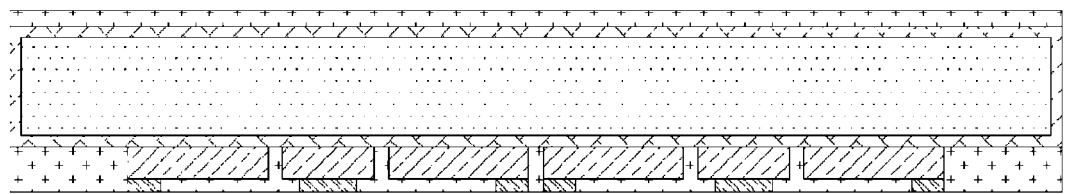

Referring to FIG. 8, the region of the bottom surface of the metal substrate from which the part of the photoresist film has been removed in step 7 is plated with the high conductivity metal wiring layer, so that a die pad and a lead are formed. The high conductivity metal wiring layer may be made from copper, aluminum, nickel, silver, gold, copper-silver, nickel-gold, nickel-palladium-gold or the like. In practice, other metallic materials which can have a conductive function may be used, which are not limited thereto. And the plating may be chemical deposition or electrolytic plating.

Figure 9:
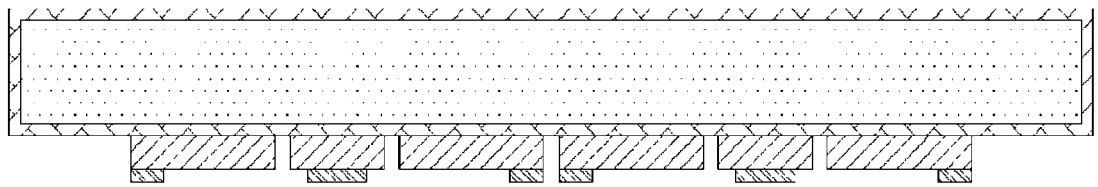

Step 9, removing the photoresist film,

Referring to FIG. 9, the photoresist film on the surface of the metal substrate is removed. And the photoresist film may be removed by softening with chemical and cleaning with high pressure water.

Step 10, molding with epoxy resin.

Figure 10:
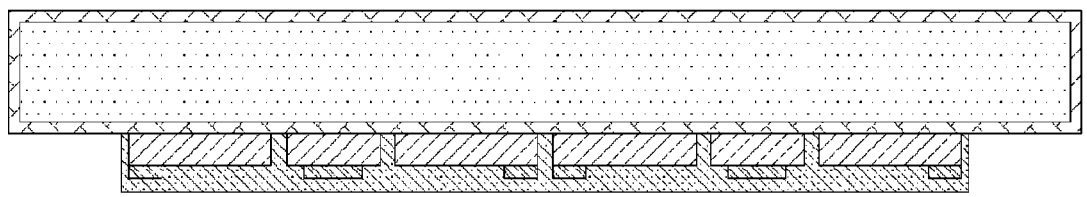

Referring to FIG. 10, the molding with the epoxy resin for protecting is performed on a surface of the metal wiring layer and a high conductive metal wiring layer provided on the bottom surface of the metal substrate. The epoxy resin material may be an epoxy resin with or without filler depending on the product characteristic. And the molding may be performed by potting using a mould, spraying using a spraying equipment, film attaching, or glue bushing.

Step 11, grinding a surface of the epoxy resin.

Figure 11:
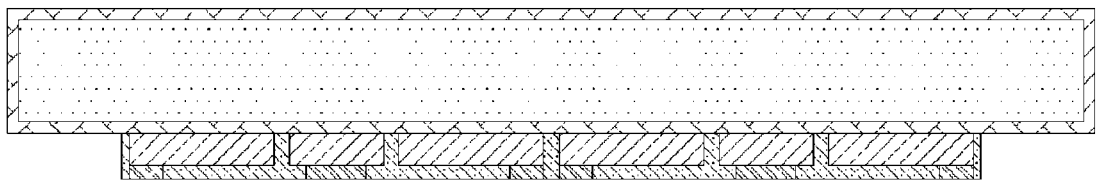

Referring to FIG. 11, the surface of the epoxy resin is ground after the molding with the epoxy resin has been performed, so as to expose the high conductivity metal wiring layer, which functions as an outer lead, from a surface of the molded body and control the thickness of the epoxy resin.

Step 12, applying a photoresist film.

Figure 12:
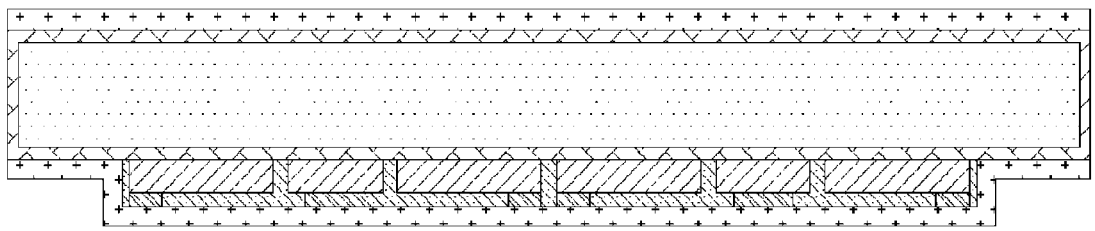

Referring to FIG. 12, the top surface and the bottom surface of the metal substrate are applied with the photoresist film which can be exposed and developed after the surface of the epoxy resin has been ground in step 11. The photoresist film may be a dry photoresist film or a wet photoresist film.

Step 13, removing a part of the photoresist film on the top surface of the metal substrate.

Figure 13:
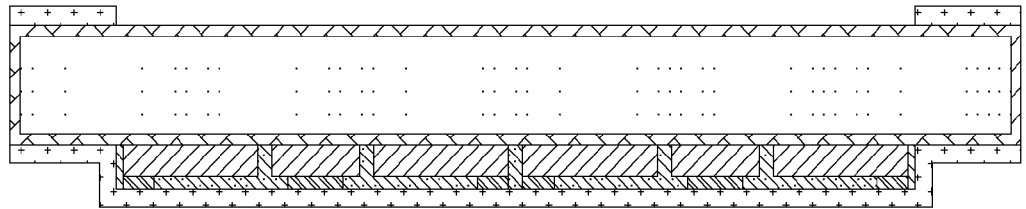

Referring to FIG. 13, the top surface of the metal substrate, which has been applied with the photoresist film in step 12, is exposed and developed with a pattern using an exposure and development equipment, and the part of the photoresist film in the pattern is removed, so as to expose a region of the top surface of the metal substrate to be etched later.

Step 14, chemical etching.

Figure 14:
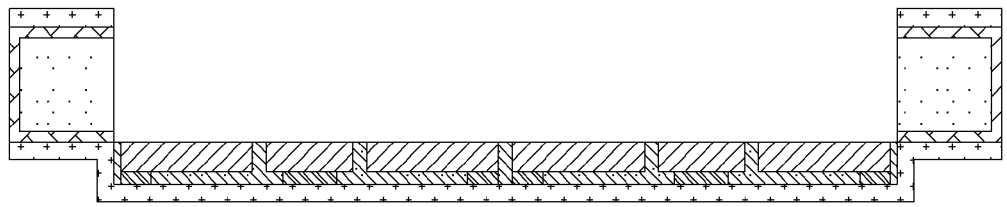

Referring to FIG. 14, chemical etching is performed in the region of the top surface of the metal substrate in which exposing and developing have been performed in step 13, till the metal wiring layer is reached. The etching may be performed using copper chloride, ferric chloride, or other solutions which may be used for chemical etching.

Step 15, applying a photoresist film.

Figure 15:
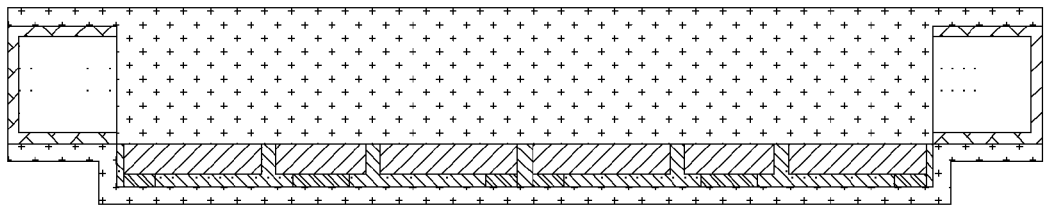

Referring to FIG. 15, the top surface and the bottom surface of the metal substrate are applied with the photoresist film which can be exposed and developed after the chemical etching has been performed in step 14. The photoresist film may be a dry photoresist film or a wet photoresist film.

Step 16, removing a part of the photoresist film on the top surface of the metal substrate.

Figure 16:
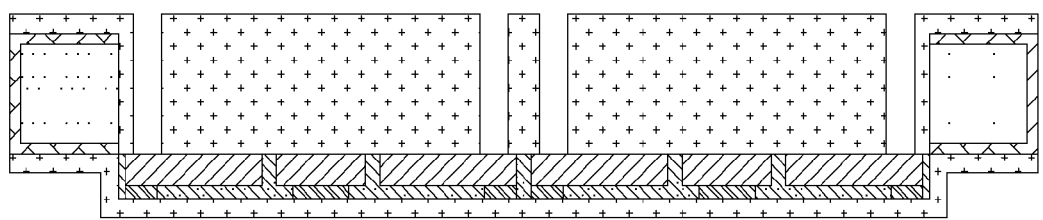

Referring to FIG. 16, the top surface of the metal substrate, which has been applied with the photoresist film in step 15, is exposed and developed with a pattern using an exposure and development equipment, and the part of the photoresist film in the pattern is removed, so as to expose a region of the top surface of the metal substrate to be plated later.

Step 17, plating with a metal pillar.

Figure 17:
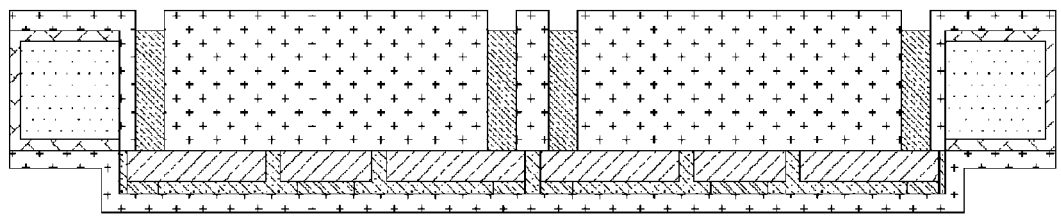

Referring to FIG. 17, the region of the top surface of the metal substrate from which the part of the photoresist film has been removed in step 16 is plated with the metal pillar. The metal pillar may be made from copper, aluminum, nickel, silver, gold, copper-silver, nickel-gold, nickel-palladium-gold or the like. In practice, other metallic materials which can have a conductive function may be used, which are not limited thereto. And the plating may be chemical deposition or electrolytic plating.

Step 18, removing the photoresist film.

Figure 18:
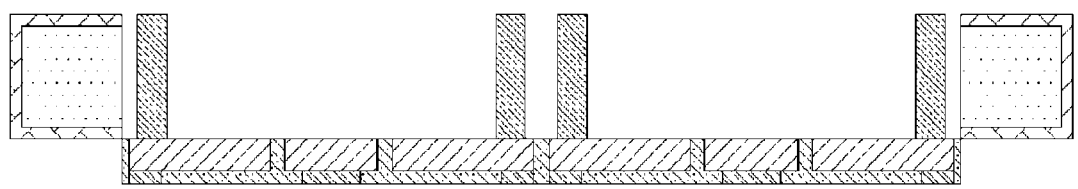

Referring to FIG. 18, the photoresist film on the surface of the metal substrate is removed. And the photoresist film may be removed by softening with chemical and cleaning with high pressure water.

Step 19, coating with an adhesive material.

Figure 19:
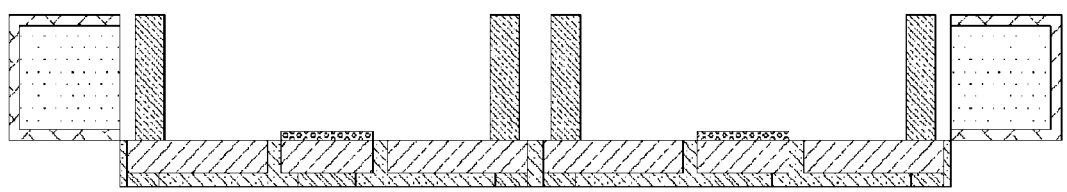

Referring to FIG. 19, a top surface of the die pad is coated with a conductive or non-conductive adhesive material after the photoresist film on the surface of the metal substrate has been removed in step 18, so as to bond a chip to be bonded later to the die pad.

Step 20, bonding dies.

Figure 20:
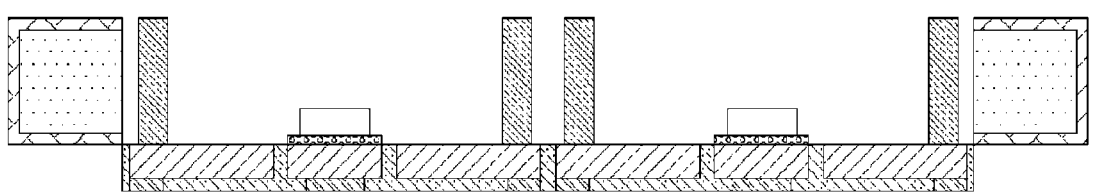

Referring to FIG. 20, the chip is bonded in the conductive or non-conductive adhesive material in step 19.

Step 21, bonding a metal wire.

Figure 21:
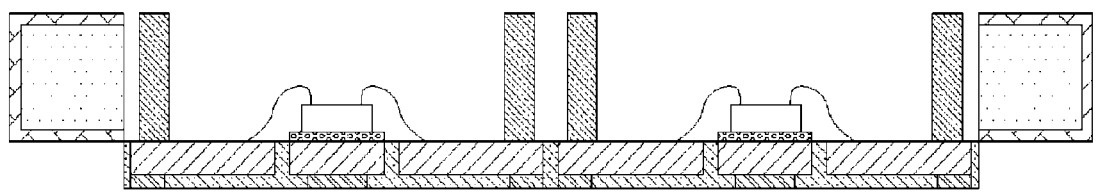

Referring to FIG. 21, the metal wire is bonded between a top surface of the chip and the lead. The metal wire may be made from gold, silver, copper, aluminum or alloy. A shape of the metal wire may be filament or banding.

Step 22, encapsulating.

Figure 22:
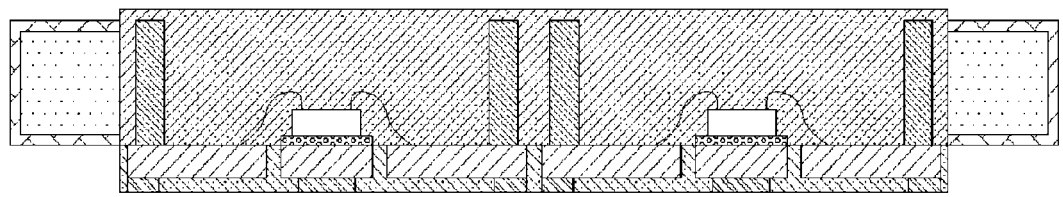

Referring to FIG. 22, the molding with a molding material is performed on the top surface of the metal substrate in step 21. And the molding may be performed by potting using a mould, spraying using a spraying equipment, film attaching, or glue bushing. The molding material may be an epoxy resin with or without filler.

Step 23, grinding a surface of the epoxy resin.

Figure 23:
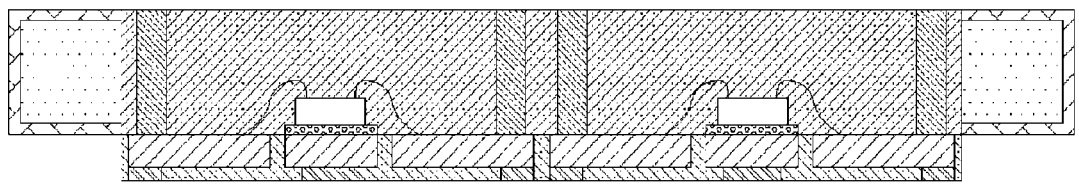

Referring to FIG. 23, the surface of the epoxy resin is ground after the molding with the epoxy resin has been performed in step 22, so as to expose the metal pillar from a surface of the molded body and control the thickness of the epoxy resin.

Step 24, plating with an anti-oxidizing metal layer or coating with an organic solderability preservative (OSP).

Figure 24:
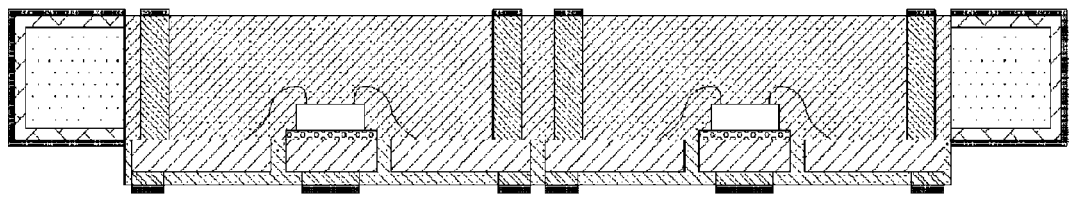

Referring to FIG. 24, an exposed surface of the metal substrate is plated with the anti-oxidizing metal layer for preventing the metal from being oxidized, such as gold, nickel-gold, nickel-palladium-gold or tin, or is coated with the organic solderability preservative (OSP) after the surface of the epoxy resin has been ground in step 23.

Step 25, stacking with a package.

Figure 25:
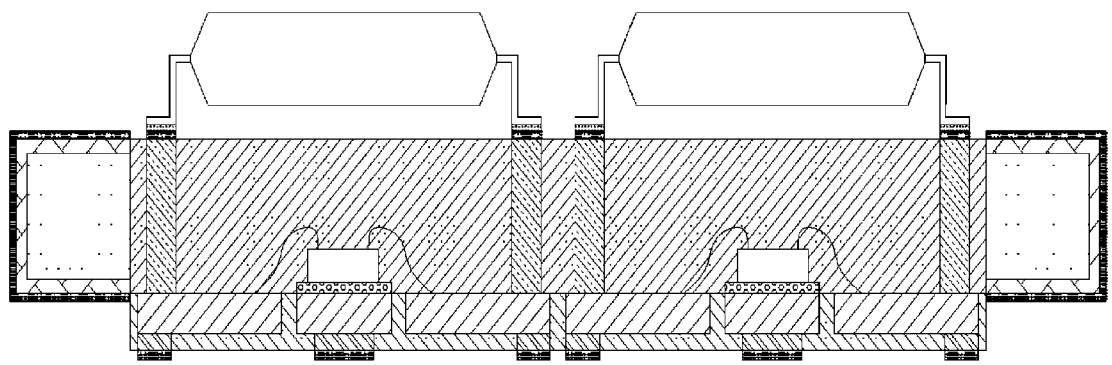

Referring to FIG. 25, after the plating with the anti-oxidizing metal layer or the coating with the organic solderability preservative has been performed in step 24, the metal pillar or a bottom surface of the lead is coated with a conductive material or bonded with a first metal ball, and then stacked with the package or the bottom surface of the lead, and finally it is subjected to reflowing.

Step 26, package sawing to form a finished product.

Figure 26:
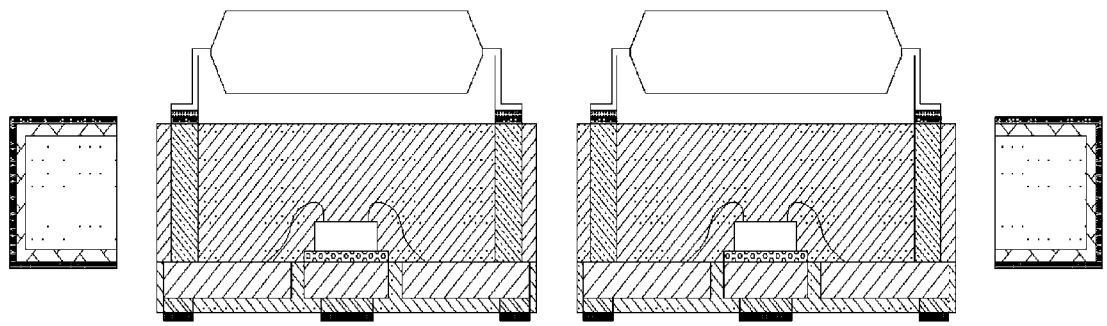

Referring to FIG. 26, a semi-finished product is package sawed after the stacking with the package has been performed in step 25, so that molded body modules which are integrated initially in a manner of array aggregate and contain chips are package sawed to be separated from one another, to form a first-etched and later-packaged three-dimensional system-in-package normal chip stack package structure. The package sawing may be performed using a conventional diamond blade and a conventional package sawing equipment.

Second Embodiment

Stacking with a J-Shaped Lead Package

Figure 28:
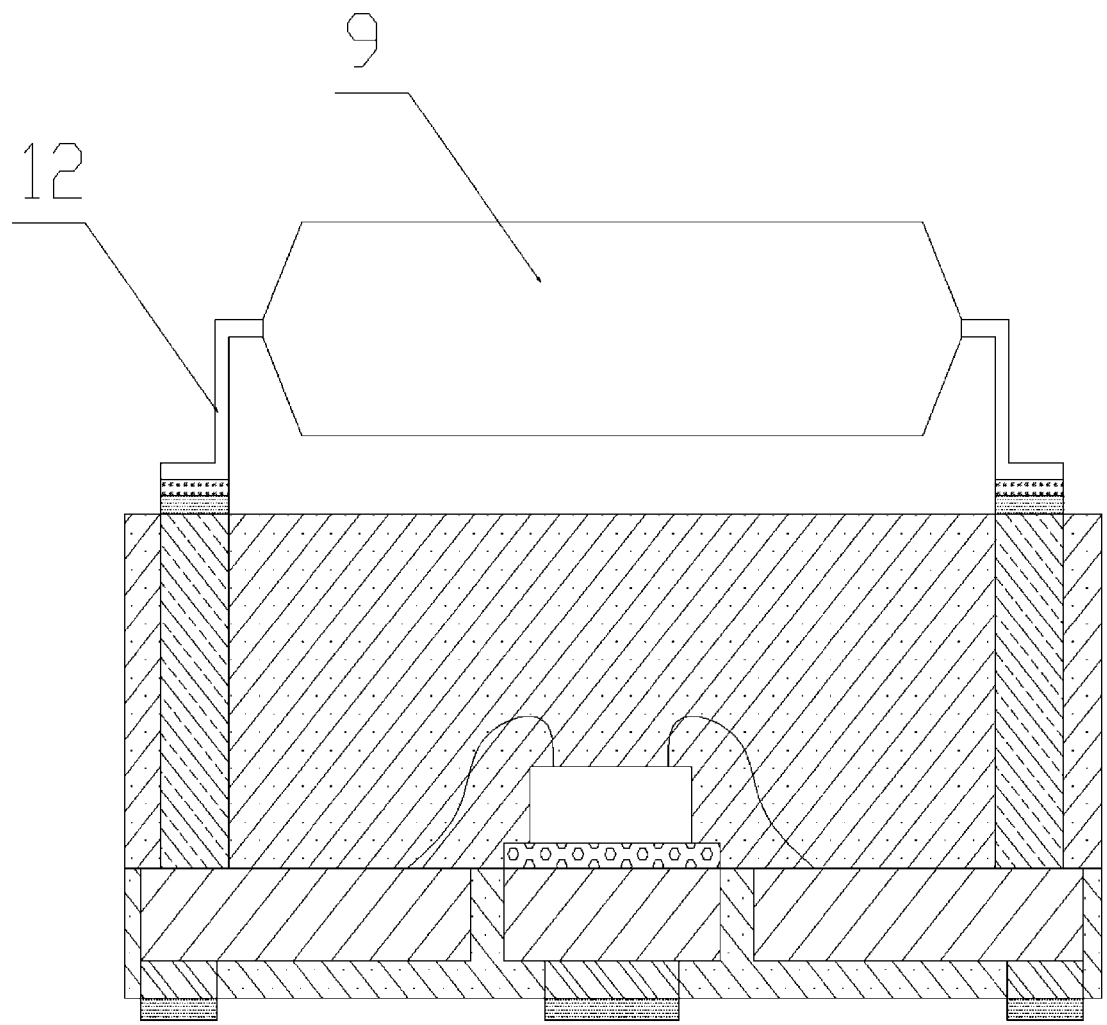
FIG. 28 is a schematic diagram of a first-etched and later-packaged three-dimensional system-in-package normal chip stack package structure according to a second embodiment of the present disclosure.

Referring to FIG. 28, which is a schematic structural diagram of a first-etched and later-packaged three-dimensional system-in-package normal chip stack package structure according to a second embodiment of the present disclosure, the second embodiment differs from the first embodiment in that an outer lead of the package 9 is a J-shaped lead.

Third Embodiment

Stacking with an L-Shaped Lead Package

Figure 29:
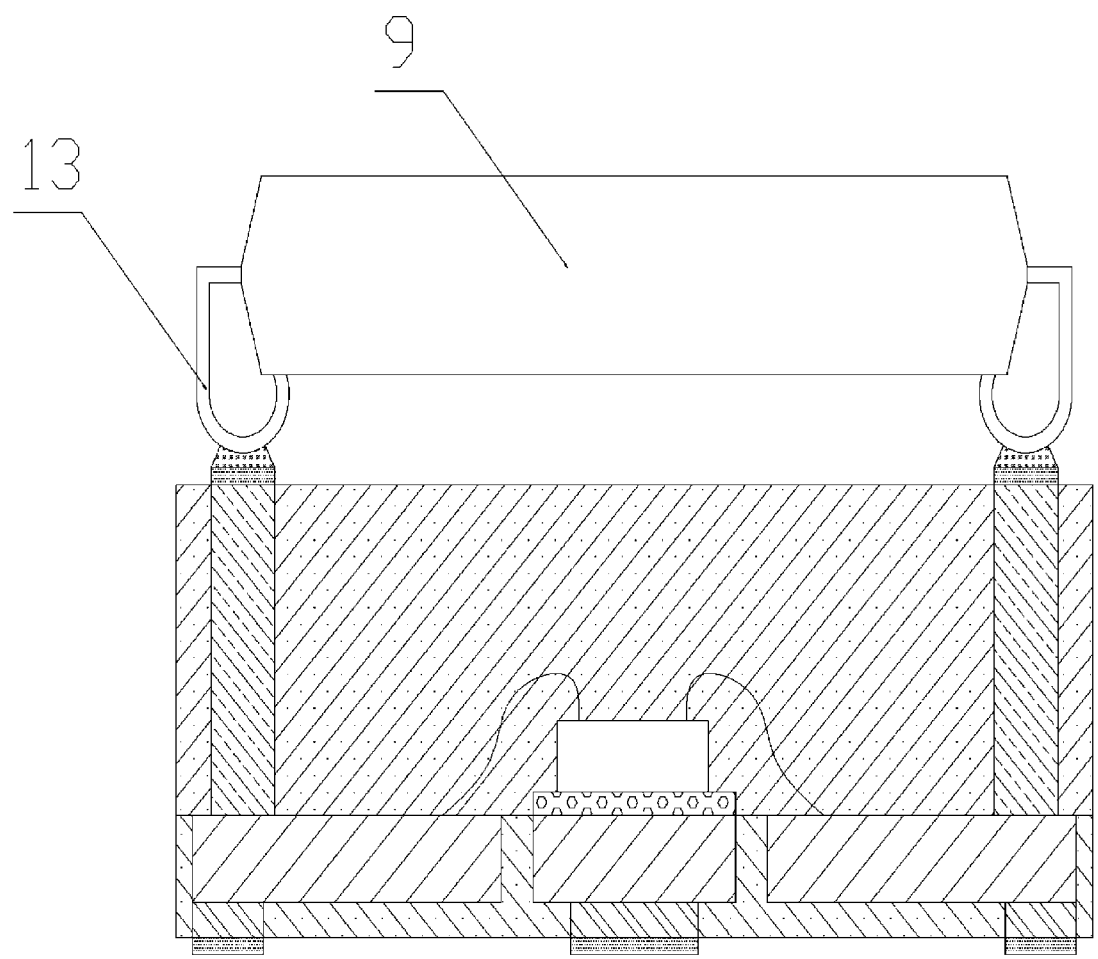
FIG. 29 is a schematic diagram of a first-etched and later-packaged three-dimensional system-in-package normal chip stack package structure according to a third embodiment of the present disclosure.

Referring to FIG. 29, which is a schematic structural diagram of a first-etched and later-packaged three-dimensional system-in-package normal chip stack package structure according to a third embodiment of the present disclosure, the third embodiment differs from the first embodiment in that an outer lead of the package 9 is an L-shaped lead.

Fourth Embodiment

Stacking with a Package Via a Metal Ball

Figure 30:
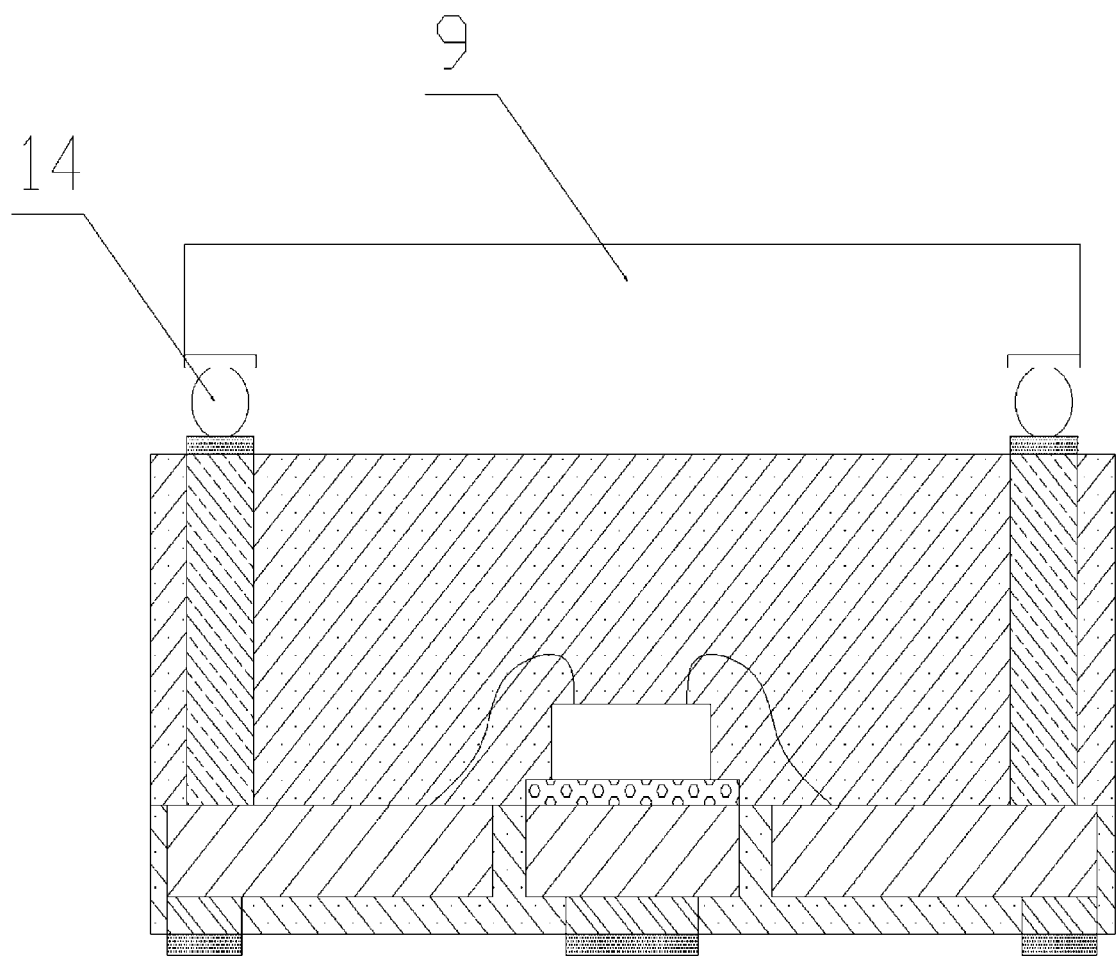
FIG. 30 is a schematic diagram of a first-etched and later-packaged three-dimensional system-in-package normal chip stack package structure according to a fourth embodiment of the present disclosure.

Referring to FIG. 30, which is a schematic structural diagram of a first-etched and later-packaged three-dimensional system-in-package normal chip stack package structure according to a fourth embodiment of the present disclosure, the fourth embodiment differs from the first embodiment in that the conductive pillar is stacked with the package 9 via a first metal ball 14.

Fifth Embodiment

Stacking with a Package to Form a Bump Structure

Figure 31:
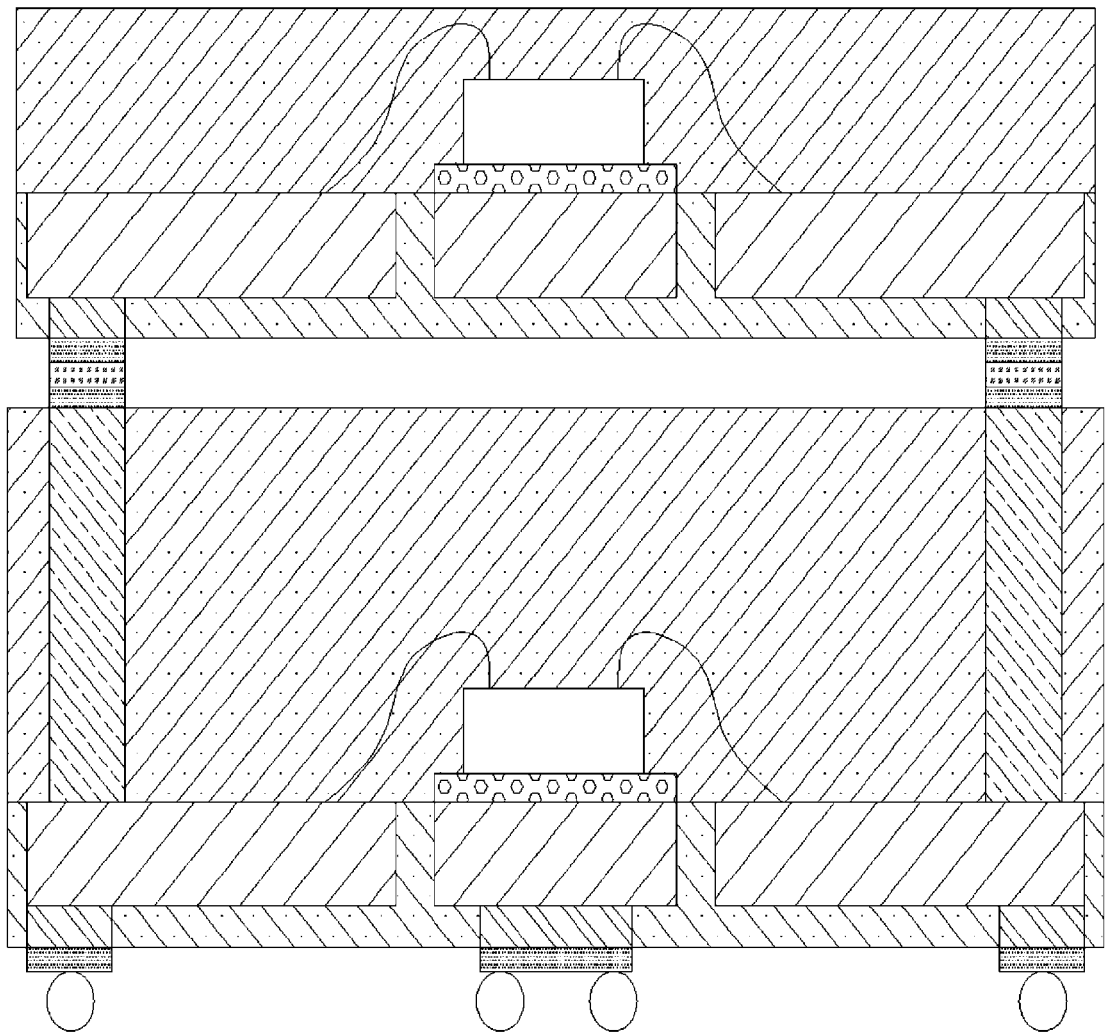
FIG. 31 and FIG. 32 are schematic diagrams of a first-etched and later-packaged three-dimensional system-in-package normal chip stack package structure according to a fifth embodiment of the present disclosure.
Figure 32:
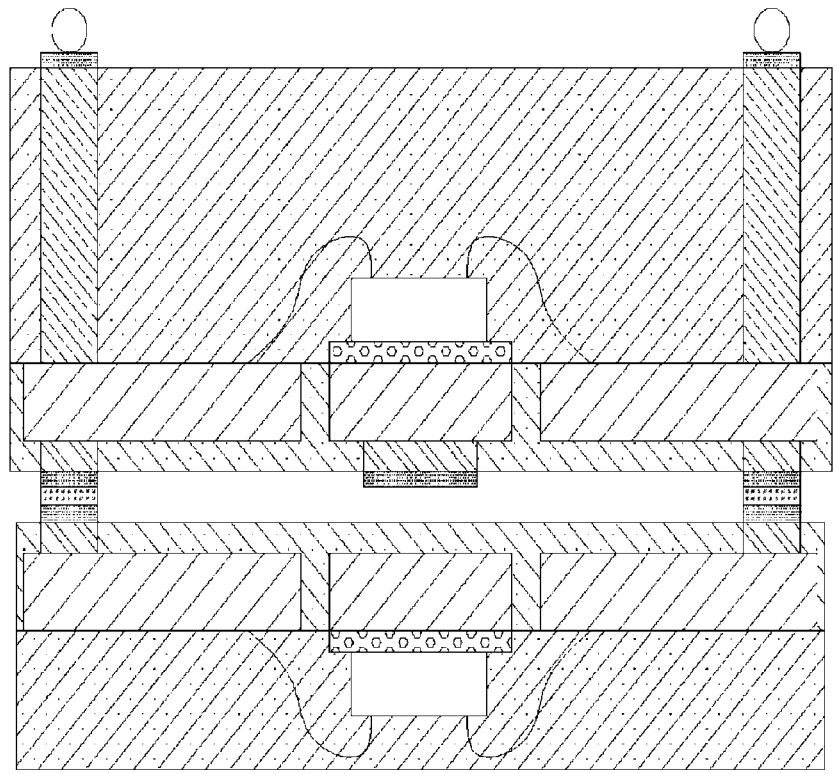

Referring to FIG. 31 and FIG. 32, which are a schematic structural diagram of a first-etched and later-packaged three-dimensional system-in-package normal chip stack package structure according to a fifth embodiment of the present disclosure, the fifth embodiment differs from the first embodiment in that a second metal ball 15 is provided on the top of the conductive pillar 6 or on the bottom surface of the lead 2.

Sixth Embodiment

Multiple-Layer Wiring, Single Normal Chip, Lap Lead

Figure 79:
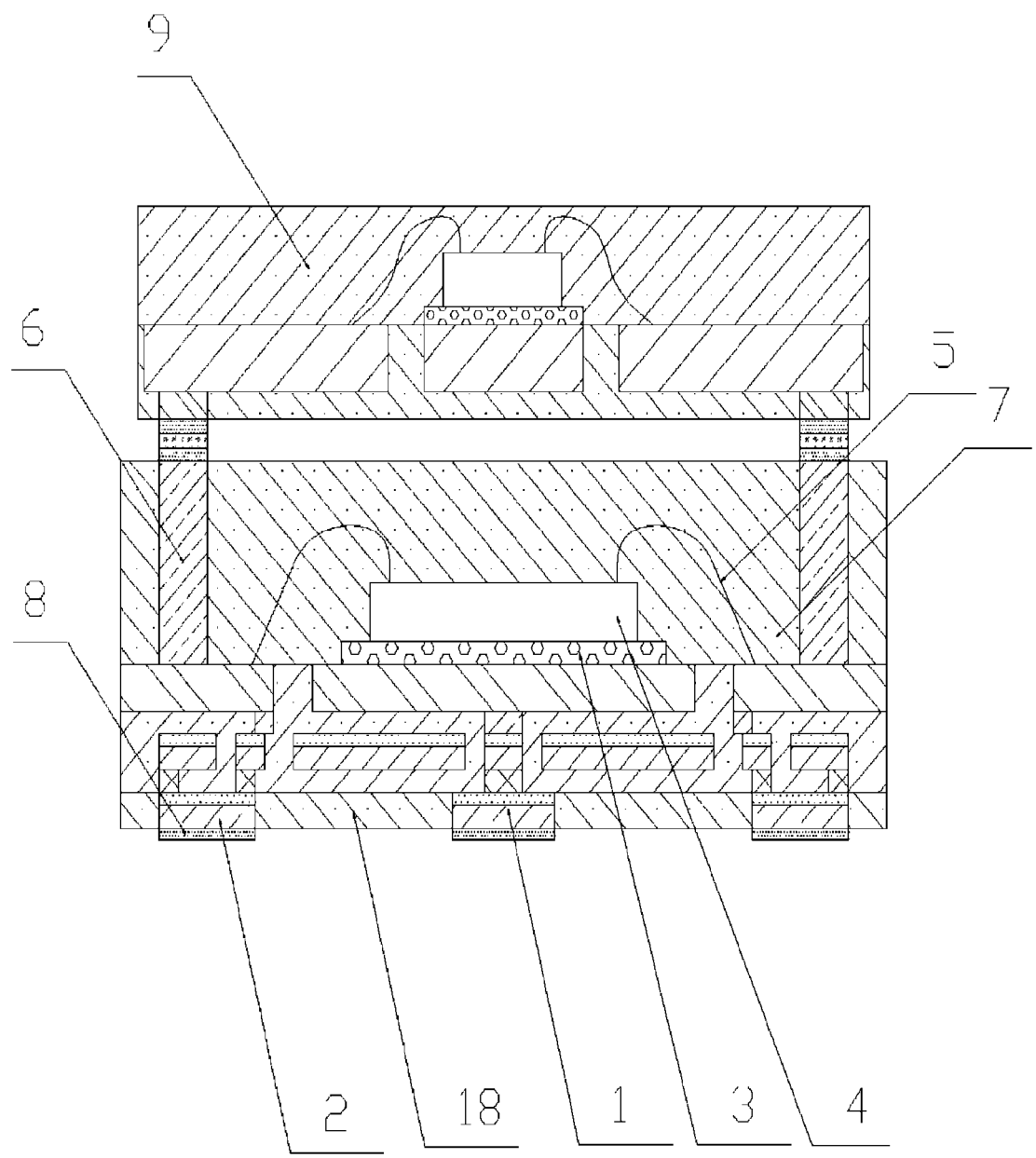
FIG. 79 is a schematic diagram of a first-etched and later-packaged three-dimensional system-in-package normal chip stack package structure according to the sixth embodiment of the present disclosure.

Referring to FIG. 79, which is a schematic structural diagram of a first-etched and later-packaged three-dimensional system-in-package normal chip stack package structure according to a sixth embodiment of the present disclosure, the sixth embodiment differs from the first embodiment in that the die pad 1 or the lead 2 includes multiple metal wiring layers; two adjacent metal wiring layers are connected via a conductive pillar; adjacent wirings are insulated by a non-conductive adhesive film 18; a chip 4 is provided on the top surface of the die pad 1 by a conductive or non-conductive adhesive material 3; and a conductive pillar 6 is provided on the bottom surface of the lead 2.

A processing method thereof is shown below, which includes steps 1 to 46.

Step 1, providing a metal substrate.

Figure 33:
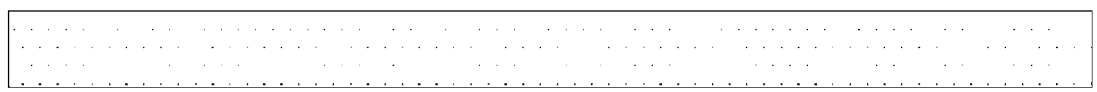
FIG. 33 to FIG. 78 are respectively flowcharts of a method for manufacturing a first-etched and later-packaged three-dimensional system-in-package normal chip stack package according to a sixth embodiment of the present disclosure.

Referring to FIG. 33, the metal substrate having a suitable thickness is provided, which is used as a transitional material for supporting a wiring layer structure during manufacturing wiring and packaging later. The substrate is mainly made from a metal material which may be copper material, iron material, galvanized material, stainless steel, aluminum material, or metallic or non-metallic material which can have a conductive function.

Step 2, pre-plating a surface of the metal substrate with a micro copper layer.

Figure 34:
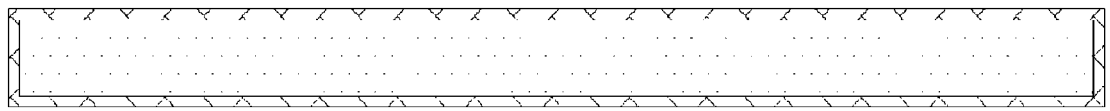

Referring to FIG. 34, the surface of the metal substrate is pre-plated with a micro copper layer. The micro copper layer has a thickness of 2 µm to 10 µm, which can also be thinned or thickened depending on the function requirement, so that a wiring layer can be bonded to the metal substrate tightly during the wiring manufacturing later. And the plating may be chemical deposition or electrolytic plating.

Step 3, applying a photoresist film.

Figure 35:
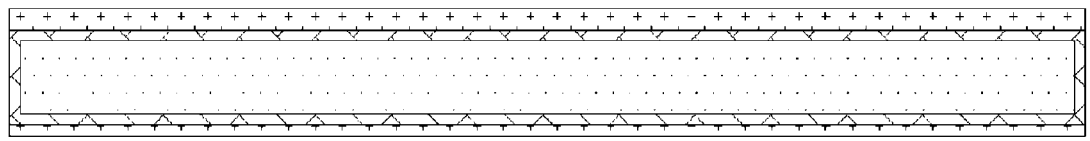

Referring to FIG. 35, a top surface and a bottom surface of the metal substrate which have been pre-plated with the micro copper layer are respectively applied with the photoresist film which can be exposed and developed, so as to protect the proceeding of plating with a metal layer later. The photoresist film may be a dry photoresist film or a wet photoresist film.

Step 4, removing a part of the photoresist film on the bottom surface of the metal substrate.

Figure 36:
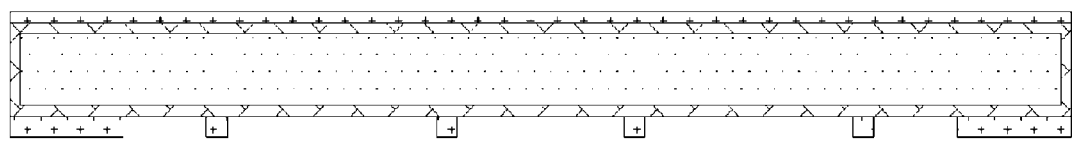

Referring to FIG. 36, the bottom surface of the metal substrate, which has been applied with the photoresist film in step 3, is exposed and developed with a pattern using an exposure and development equipment, and the part of the photoresist film in the pattern is removed, so as to expose a region of the bottom surface of the metal substrate to be plated later.

Step 5, plating with a first metal wiring layer.

Figure 37:
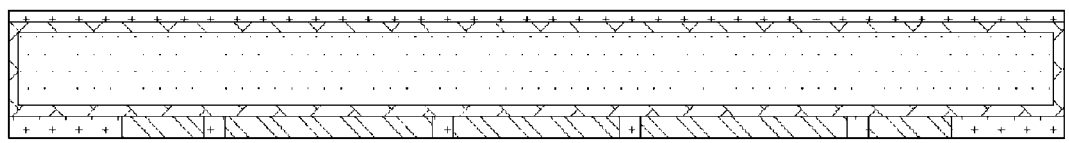

Referring to FIG. 37, the region of the bottom surface of the metal substrate from which the part of the photoresist film has been removed in step 4 is plated with the first metal wiring layer. The first metal wiring layer may be made from copper, aluminum, nickel, silver, gold, copper-silver, nickel-gold, nickel-palladium-gold or the like. In practice, other metallic materials which can have a conductive function may be used, which are not limited thereto. The first metal wiring layer commonly has a thickness of 5 μm to 20 μm, and the plated thickness can be changed depending on the different characteristic. And the plating may be chemical deposition or electrolytic plating.

Step 6, applying a photoresist film.

Figure 38:
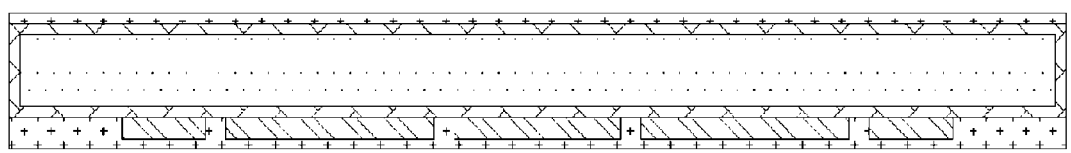

Referring to FIG. 38, the bottom surface of the metal substrate in step 5 is applied with the photoresist film which can be exposed and developed. The photoresist film may be a dry photoresist film or a wet photoresist film.

Step 7, removing a part of the photoresist film on the bottom surface of the metal substrate.

Figure 39:
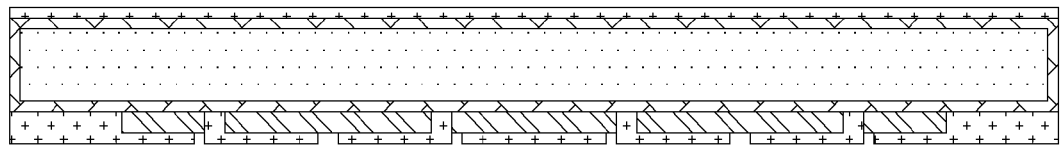

Referring to FIG. 39, the bottom surface of the metal substrate, which has been applied with the photoresist film in step 6, is exposed and developed with a pattern using an exposure and development equipment, and the part of the photoresist film in the pattern is removed, so as to expose a region of the bottom surface of the metal substrate to be plated later.

Step 8, plating with a second metal wiring layer.

Figure 40:
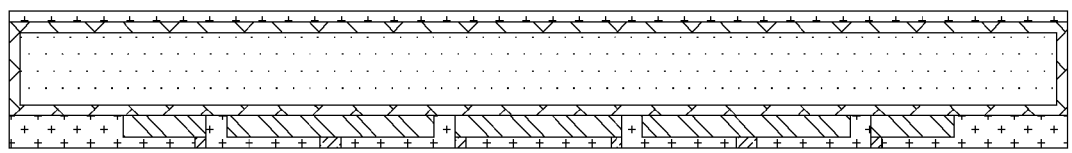

Referring to FIG. 40, the region of the bottom surface of the metal substrate from which the part of the photoresist film has been removed in step 7 is plated with the second metal wiring layer, which serves as a conductive pillar to connect the first metal wiring layer to a third metal wiring layer. The metal wiring layer may be made from copper, nickel-gold, nickel-palladium-gold, silver, gold, tin, or the like. And the plating may be chemical deposition or electrolytic plating.

Step 9, removing the photoresist film.

Figure 41:
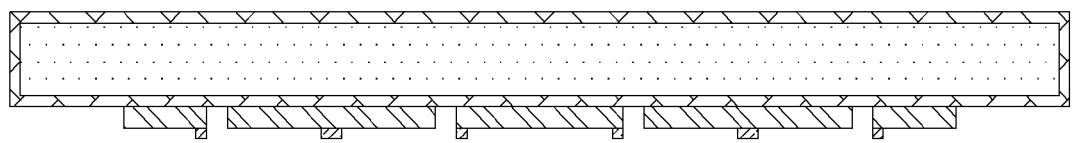
Figure 42:
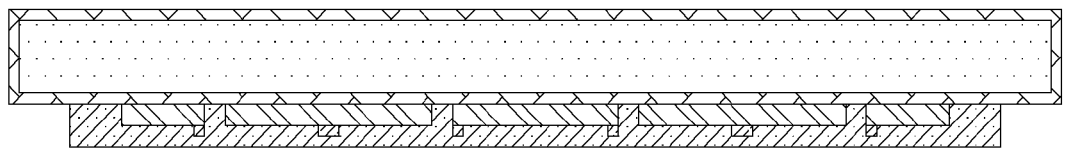

Referring to FIG. 41, the photoresist film on the surface of the metal substrate is removed, so as to perform applying a non-conductive adhesive film. And the photoresist film may be removed by softening with chemical and cleaning with high pressure water.

Step 10, applying the non-conductive adhesive film.

Referring to FIG. 41, a region of the bottom surface of the metal substrate in which the wiring layer is provided is applied with a layer of the non-conductive adhesive film, so as to insulate the first metal wiring layer from the third metal wiring layer. The applying the non-conductive adhesive film may be performed using a conventional rolling equipment or in a vacuum environment to prevent air from being trapped during the pasting process. The non-conductive adhesive film is mainly made from a thermosetting epoxy resin. The epoxy resin may be an epoxy resin with or without filler depending on the product characteristic. And the epoxy resin can be dyed depending on the product characteristic.

Step 11, grinding a surface of the non-conductive adhesive film.

Figure 43:
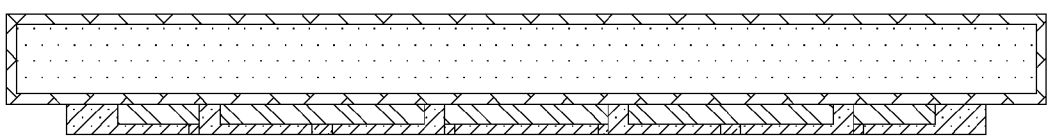

Referring to FIG. 43, the surface of the non-conductive adhesive film is ground after the applying the non-conductive adhesive film has been performed, so as to expose the second metal wiring layer, maintain the flatness of the non-conductive adhesive film and the second metal wiring layer, and control the thickness of the non-conductive adhesive film.

Step 12, performing metallization pretreatment on the surface of the non-conductive adhesive film.

Figure 44:
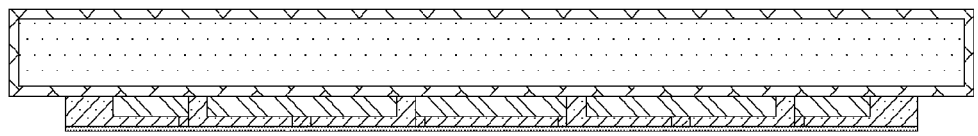

Referring to FIG. 44, the metallization pretreatment is performed on the surface of the non-conductive adhesive film, so that a layer of metallized polymer material is adhered onto the surface of the non-conductive adhesive film to serve as a catalytic converter for plating with a metal material later. The metallized polymer material may be adhered by spraying, plasma oscillation, surface roughening treatment, or the like, and then dried.

Step 13, applying a photoresist film.

Figure 45:
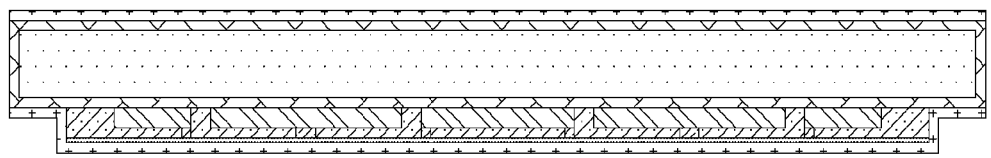

Referring to FIG. 45, the top surface and the bottom surface of the metal substrate in step 12 are applied with the photoresist film which can be exposed and developed, so as to protect the proceeding of plating with a third metal layer later. The photoresist film may be a dry photoresist film or a wet photoresist film.

Step 14, removing a part of the photoresist film on the bottom surface of the metal substrate.

Figure 46:
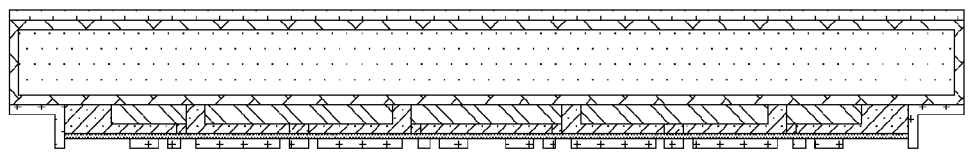

Referring to FIG. 46, the bottom surface of the metal substrate, which has been applied with the photoresist film in step 13, is exposed and developed in a pattern using an exposure and development equipment, and the part of the photoresist film in the pattern is removed, so as to expose a region of the bottom surface of the metal substrate to be etched later.

Step 15, etching.

Figure 47:
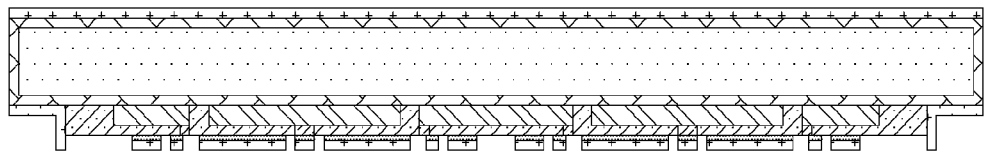

Referring to FIG. 47, the etching is performed in a region in which the part of the photoresist film has been removed in step 14, so as to etch and remove a metallized region except for a region remained for a metal wiring. The etching may be performed using copper chloride, ferric chloride, or other solutions which may be used for chemical etching.

Step 16, removing the photoresist film on the bottom surface of the metal substrate.

Figure 48:
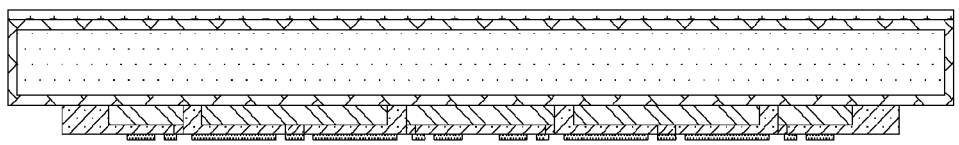

Referring to FIG. 48, the photoresist film on the bottom surface of the metal substrate is removed, so as to expose a metallized region to be plated later.

Step 17, plating with a third metal wiring layer.

Figure 49:
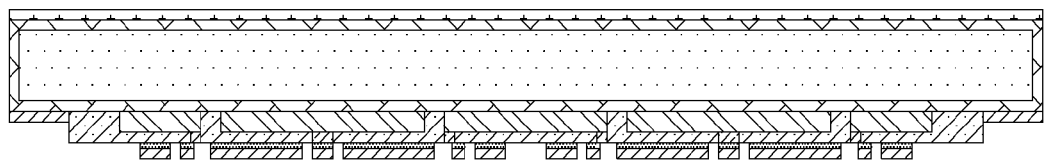

Referring to FIG. 49, the bottom surface of the metal substrate in step 16 is plated with the third metal wiring layer. The third metal wiring layer may be made from copper, nickel-gold, nickel-palladium-gold, silver, gold, or tin. And the plating may be chemical deposition together with electrolytic plating, or completely chemical deposition to obtain a required thickness.

Step 18, applying a photoresist film.

Figure 50:
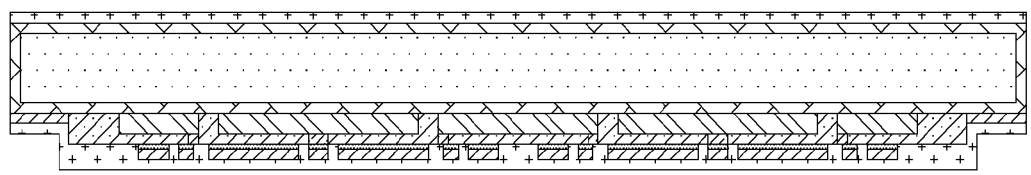

Referring to FIG. 50, the bottom surface of the metal substrate in step 17 is applied with the photoresist film which can be exposed and developed, so as to manufacture a metal wiring pattern later. The photoresist film may be a dry photoresist film or a wet photoresist film.

Step 19, removing a part of the photoresist film on the bottom surface of the metal substrate.

Figure 51:
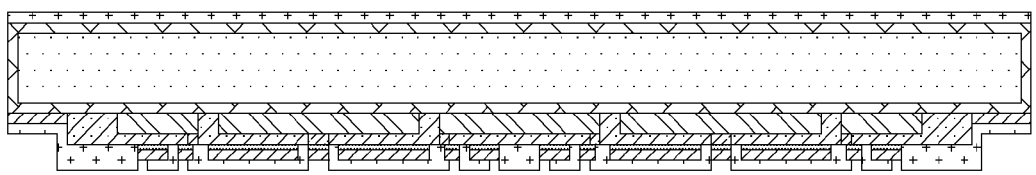

Referring to FIG. 51, the bottom surface of the metal substrate, which has been applied with the photoresist film in step 18, is exposed and developed with a pattern using an exposure and development equipment, and the part of the photoresist film in the pattern is removed, so as to expose a region of the bottom surface of the metal substrate to be plated later.

Step 20, plating with a fourth metal wiring layer.

Figure 52:
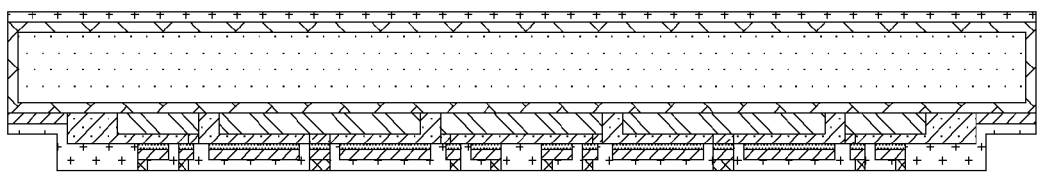

Referring to FIG. 52, the region of the bottom surface of the metal substrate from which the part of the photoresist film has been removed in step 19 is plated with the fourth metal wiring layer, which serves as a conductive pillar to connect the third metal wiring layer to a fifth metal wiring layer. The metal wiring layer may be made from copper, nickel-gold, nickel-palladium-gold, silver, gold, tin, or the like. And the plating may be chemical deposition or electrolytic plating.

Step 21, removing the photoresist film.

Figure 53:
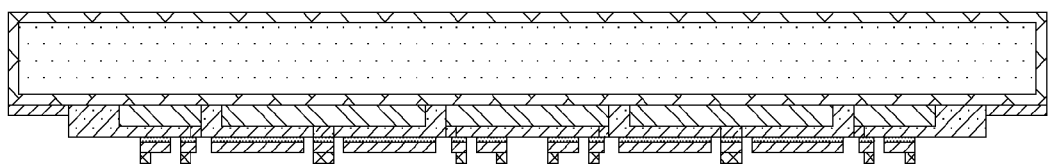

Referring to FIG. 53, the photoresist film on the surface of the metal substrate is removed, so as to perform applying a non-conductive adhesive film. And the photoresist film may be removed by softening with chemical and cleaning with high pressure water.

Step 22, applying a non-conductive adhesive film.

Figure 54:
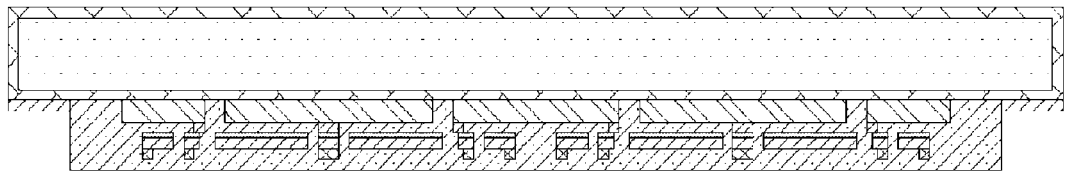

Referring to FIG. 54, a region of the bottom surface of the metal substrate in which the wiring layer is provided is applied with a layer of the non-conductive adhesive film, so as to insulate the third metal wiring layer from the fifth metal wiring layer. The applying of the non-conductive adhesive film may be performed using a conventional rolling equipment or in a vacuum environment to prevent air from being trapped during the pasting process. The non-conductive adhesive film is mainly made of a thermosetting epoxy resin. The epoxy resin may be an epoxy resin with or without filler depending on the product characteristic. And the epoxy resin can be dyed depending on the product characteristic.

Step 23, grinding a surface of the non-conductive adhesive film.

Figure 55:
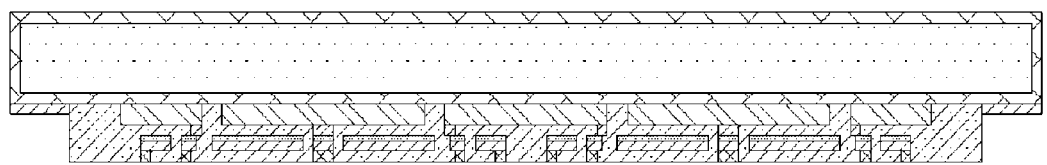

Referring to FIG. 55, the surface of the non-conductive adhesive film is ground after the applying the non-conductive adhesive film, so as to expose the fourth metal wiring layer, maintain the flatness of the non-conductive adhesive film and the fourth metal wiring layer, and control the thickness of the non-conductive adhesive film.

Step 24, performing metallization pretreatment on the surface of the non-conductive adhesive film.

Figure 56:
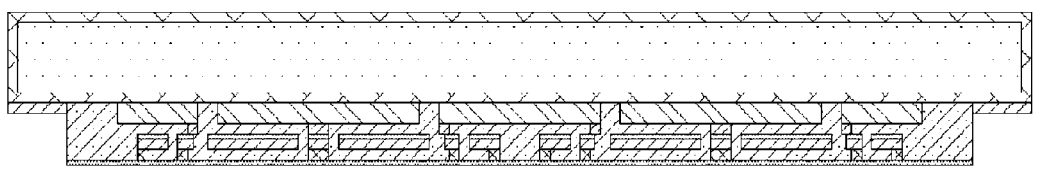

Referring to FIG. 56, the metallization pretreatment is performed on the surface of the non-conductive adhesive film, so that a layer of metallized polymer material is adhered onto the surface of the non-conductive adhesive film to serve as a catalytic converter for plating with a metal material later. The metallized polymer material may be adhered by spraying, plasma oscillation, surface roughening treatment, or the like, and then it is dried.

Step 25, applying a photoresist film.

Figure 57:
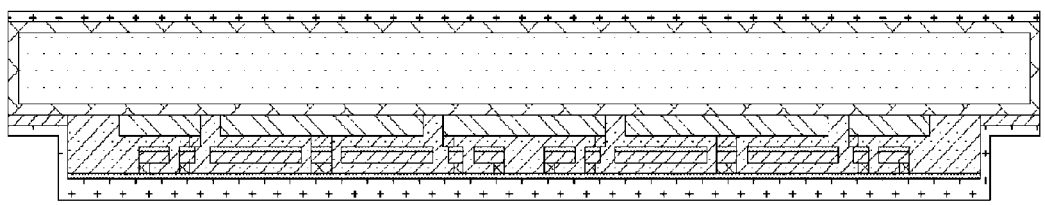

Referring to FIG. 57, the top surface and the bottom surface of the metal substrate in step 24 are applied with the photoresist film which can be exposed and developed, so as to protect the proceeding of plating with a fifth metal layer later. The photoresist film may be a dry photoresist film or a wet photoresist film.

Step 26, removing a part of the photoresist film on the bottom surface of the metal substrate.

Figure 58:
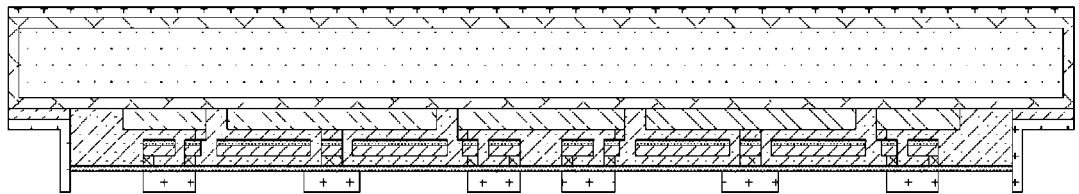

Referring to FIG. 58, the bottom surface of the metal substrate, which has been applied with the photoresist film in step 25, is exposed and developed with a pattern using an exposure and development equipment, and the part of the photoresist film in the pattern is removed, so as to expose a region of the bottom surface of the metal substrate to be etched later.

Step 27, etching.

Figure 59:
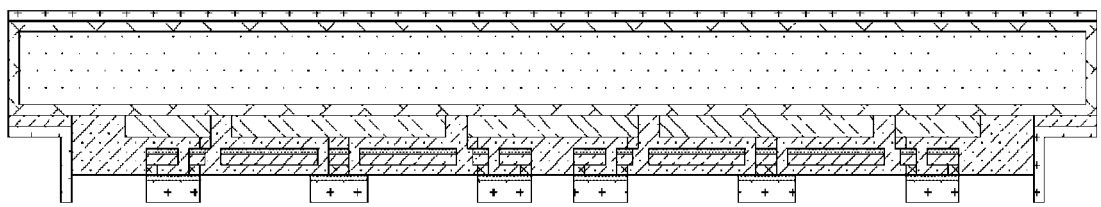

Referring to FIG. 59, the etching is performed in a region from which the part of the photoresist film has been removed in step 26, so as to etch and remove a metallized region except for a region in which plating with a metal wiring is to be performed. The etching may be performed using copper chloride, ferric chloride, or other solutions which may be used for chemical etching.

Step 28, removing the photoresist film on the bottom surface of the metal substrate.

Figure 60:
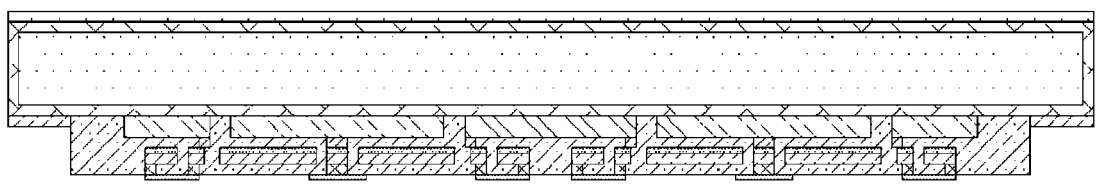

Referring to FIG. 60, the photoresist film on the bottom surface of the metal substrate is removed, so as to expose a metallized region to be plated later.

Step 29, plating with a fifth metal wiring layer.

Figure 61:
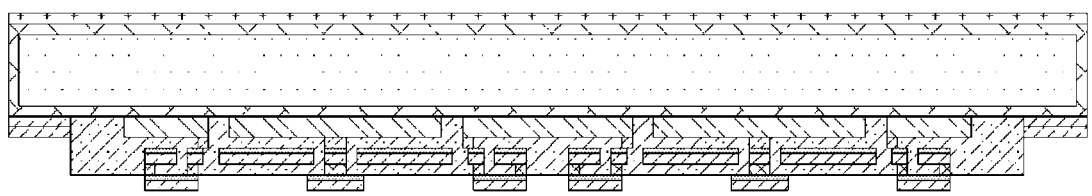

Referring to FIG. 61, the bottom surface of the metal substrate in step 28 is plated with the fifth metal wiring layer, so that a die pad and a lead are formed on the metal substrate. The fifth metal wiring layer may be made from copper, nickel-gold, nickel-palladium-gold, silver, gold, or tin. And the plating may be chemical deposition together with electrolytic plating, or completely chemical deposition so as to obtain a required thickness.

Step 30, applying a non-conductive adhesive film.

Figure 62:
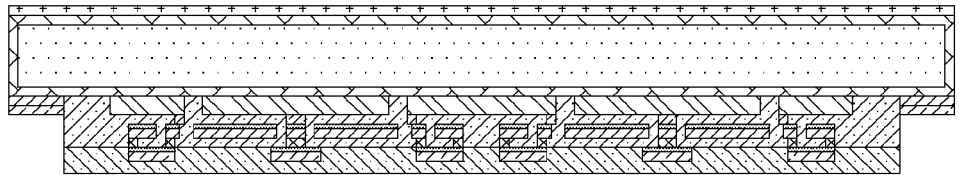

Referring to FIG. 62, a region of the bottom surface of the metal substrate in which the wiring layer is provided is applied with a layer of the non-conductive adhesive film, so as to insulate the fifth metal wiring layer from a wiring. The applying the non-conductive adhesive film may be performed using a conventional rolling equipment or in a vacuum environment to prevent air from being trapped during the pasting process. The non-conductive adhesive film is mainly made from a thermosetting epoxy resin. The epoxy resin may be an epoxy resin with or without filler depending on the product characteristic. And the epoxy resin can be dyed depending on the product characteristic.

Step 31, grinding a surface of the non-conductive adhesive film.

Figure 63:
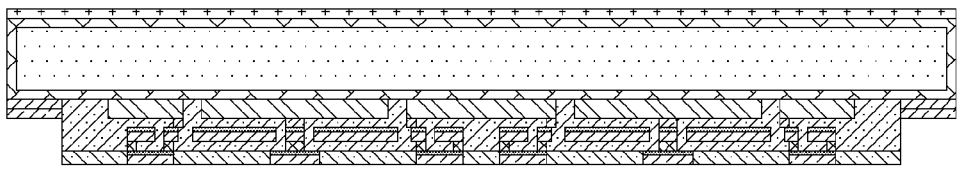

Referring to FIG. 63, the surface of the non-conductive adhesive film is ground after applying the non-conductive adhesive film, so as to expose a surface of the fifth metal wiring layer, maintain the flatness of the non-conductive adhesive film and the fifth metal wiring layer, and control the thickness of the non-conductive adhesive film.

Step 32, applying a photoresist film.

Figure 64:
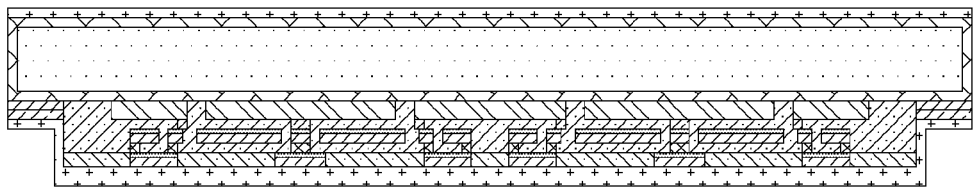

Referring to FIG. 64, the top surface the metal substrate in step 31 is applied with the photoresist film which can be exposed and developed. The photoresist film may be a dry photoresist film or a wet photoresist film.

Step 33, removing a part of the photoresist film on the top surface of the metal substrate.

Figure 65:
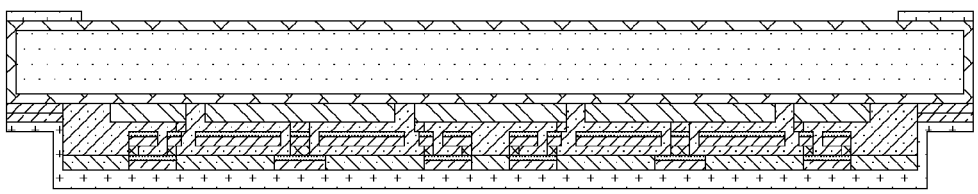

Referring to FIG. 65, the top surface of the metal substrate, which has been applied with the photoresist film in step 32, is exposed and developed with a pattern using an exposure and development equipment, and the part of the photoresist film in the pattern is removed, so as to expose a region of the top surface of the metal substrate to be etched later.

Step 34, chemical etching.

Figure 66:
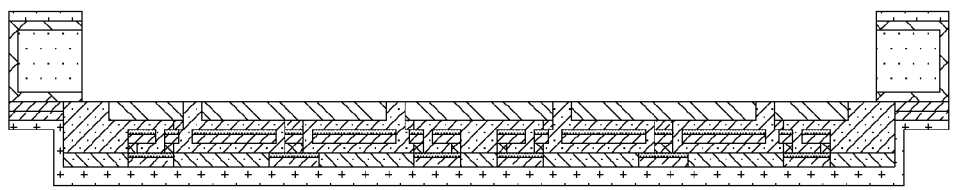

Referring to FIG. 66, the chemical etching is performed in a region on the top surface of the metal substrate in which exposing and developing have been performed in step 33, till the metal wiring layer is reached. The etching may be performed using copper chloride, ferric chloride, or other solutions which may be used for chemical etching.

Step 35, applying a photoresist film.

Figure 67:
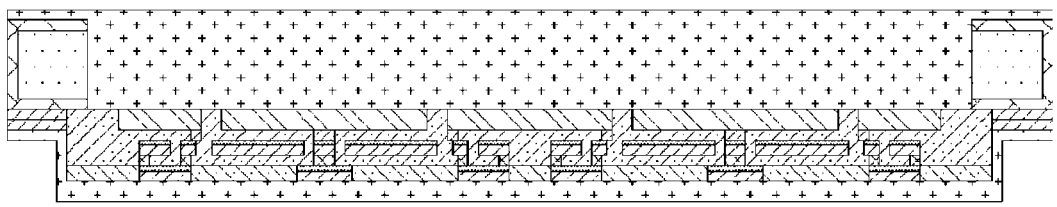

Referring to FIG. 67, the top surface of the metal substrate on which the chemical etching has been performed in step 34 is applied with the photoresist film which can be exposed and developed. The photoresist film may be a dry photoresist film or a wet photoresist film.

Step 36, removing a part of the photoresist film on the top surface of the metal substrate.

Figure 68:
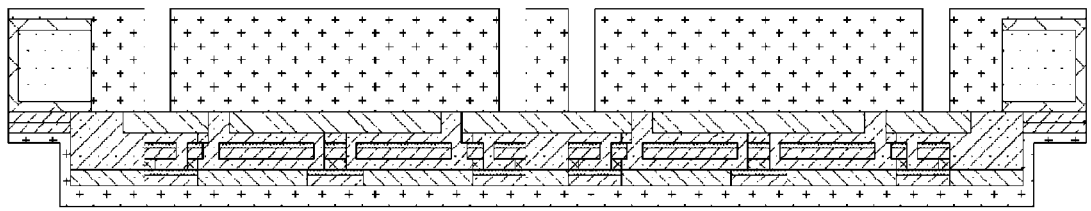

Referring to FIG. 68, the top surface of the metal substrate, which has been applied with the photoresist film in step 35, is exposed and developed with a pattern using an exposure and development equipment, and the part of the photoresist film in the pattern is removed, so as to expose a region of the top surface of the metal substrate to be plated later.

Step 37, plating with a metal pillar.

Figure 69:
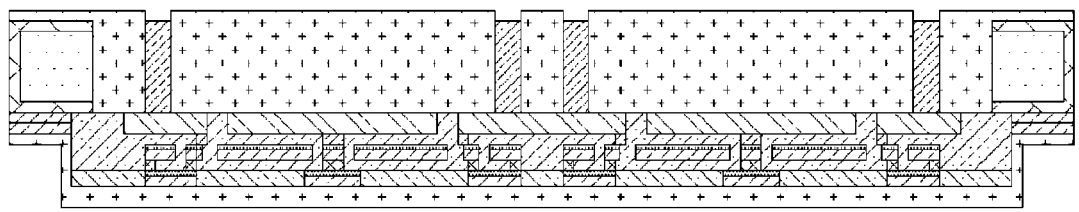

Referring to FIG. 69, the region of the top surface of the metal substrate from which the part of the photoresist film has been removed in step 36 is plated with the metal pillar. The metal pillar may be made from copper, aluminum, nickel, silver, gold, copper-silver, nickel-gold, nickel-palladium-gold, or the like. In practice, other metallic materials which can have a conductive function may be used, which are not limited thereto. And the plating may be chemical deposition or electrolytic plating.

Step 38, removing the photoresist film.

Figure 70:
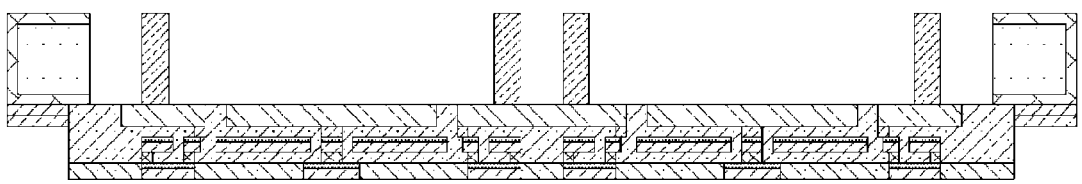

Referring to FIG. 70, the photoresist film on the surface of the metal substrate is removed. And the photoresist film may be removed by softening with chemical and cleaning with high pressure water.

Step 39, coating with an adhesive material.

Figure 71:
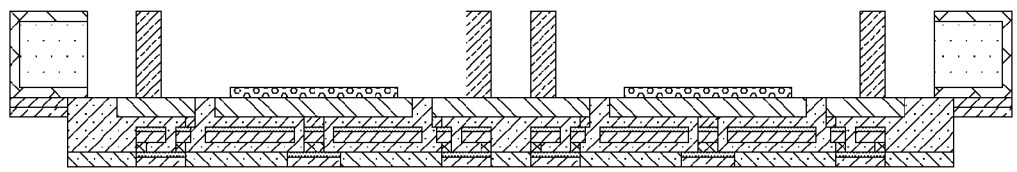

Referring to FIG. 71, a top surface of the die pad formed in step 29 is coated with a conductive or non-conductive adhesive material, so as to bond a chip to be bonded later to the die pad.

Step 40, bonding dies.

Figure 72:
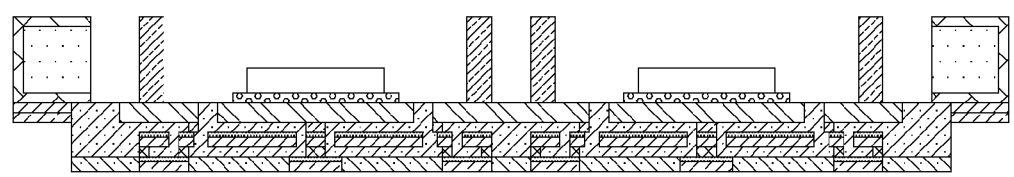

Referring to FIG. 72, the chip is bonded in a top surface of the die pad in step 39.

Step 41, bonding a metal wire.

Figure 73:
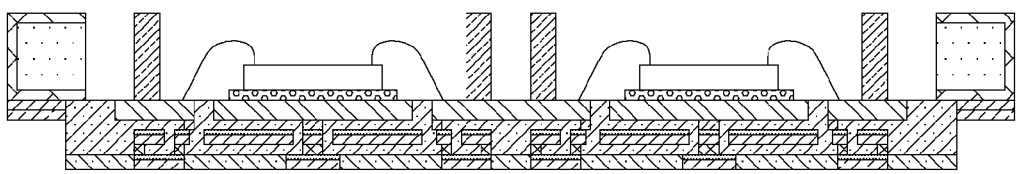

Referring to FIG. 73, the metal wire is bonded between a top surface of the chip and a top surface of the lead. The metal wire may be made from gold, silver, copper, aluminum or alloy. A shape of the metal wire may be filament or banding.

Step 42, encapsulating.

Figure 74:
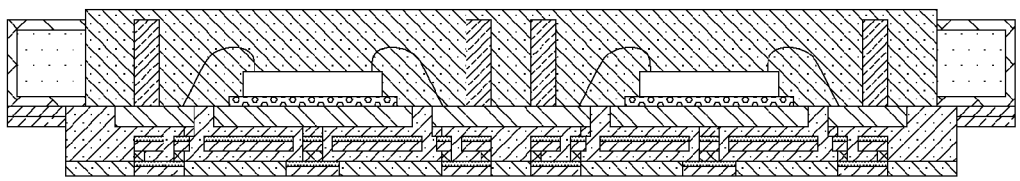

Referring to FIG. 74, the molding with a molding material is performed on the top surface of the metal substrate in step 41. And the molding may be performed by potting using a mould, spraying using a spraying equipment, film attaching, or glue bushing. The molding material may be an epoxy resin with or without filler.

Step 43, grinding a surface of the epoxy resin.

Figure 75:
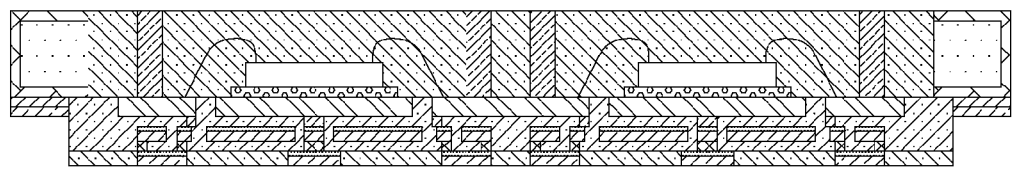

Referring to FIG. 75, the surface of the epoxy resin is ground after the molding with the epoxy resin has been performed in step 42, so as to expose the metal pillar from a surface of the molded body and control the thickness of the epoxy resin.

Step 44, plating with an anti-oxidizing metal layer or coating with an organic solderability preservative (OSP).

Figure 76:
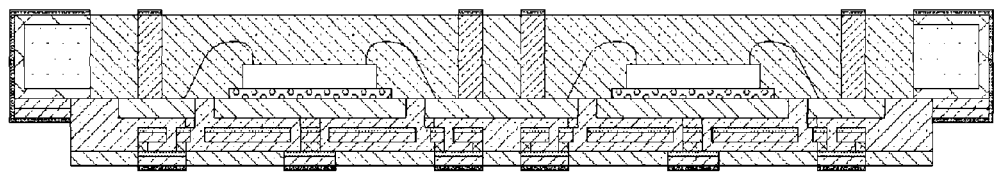

Referring to FIG. 76, an exposed surface of the metal substrate is plated with the anti-oxidizing metal layer for preventing the metal from being oxidized, such as gold, nickel-gold, nickel-palladium-gold or tin, or is coated with the organic solderability preservative (OSP) after the surface of the epoxy resin has been ground in step 43.

Step 45, stacking with a package.

Figure 77:
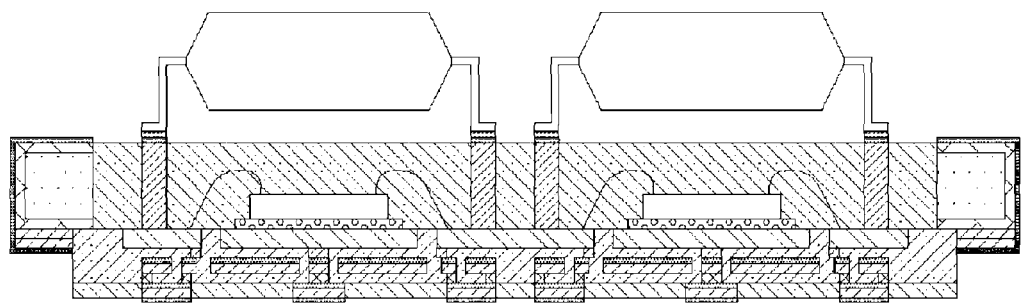

Referring to FIG. 77, after the plating with the anti-oxidizing metal layer or the coating with the organic solderability preservative has been performed in step 44, a top of the metal pillar or a bottom surface of the lead is stacked with the package via a conductive material or a first metal ball, and then subjected to reflowing.

Step 46, package sawing to form a finished product.

Figure 78:
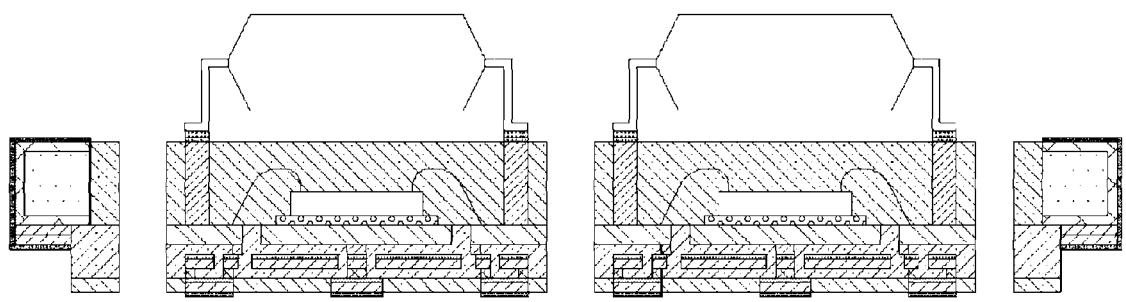

Referring to FIG. 78, a semi-finished product is package sawed after the stacking with the package has been performed in step 45 so that molded body modules which are integrated initially in a manner of array aggregate and contain chips are package sawed to be separated from one another, to form a first-etched and later-packaged three-dimensional system-in-package normal chip stack package structure. The package sawing may be performed using a conventional diamond blade and a conventional package sawing equipment.

Seventh Embodiment

Figure 80:
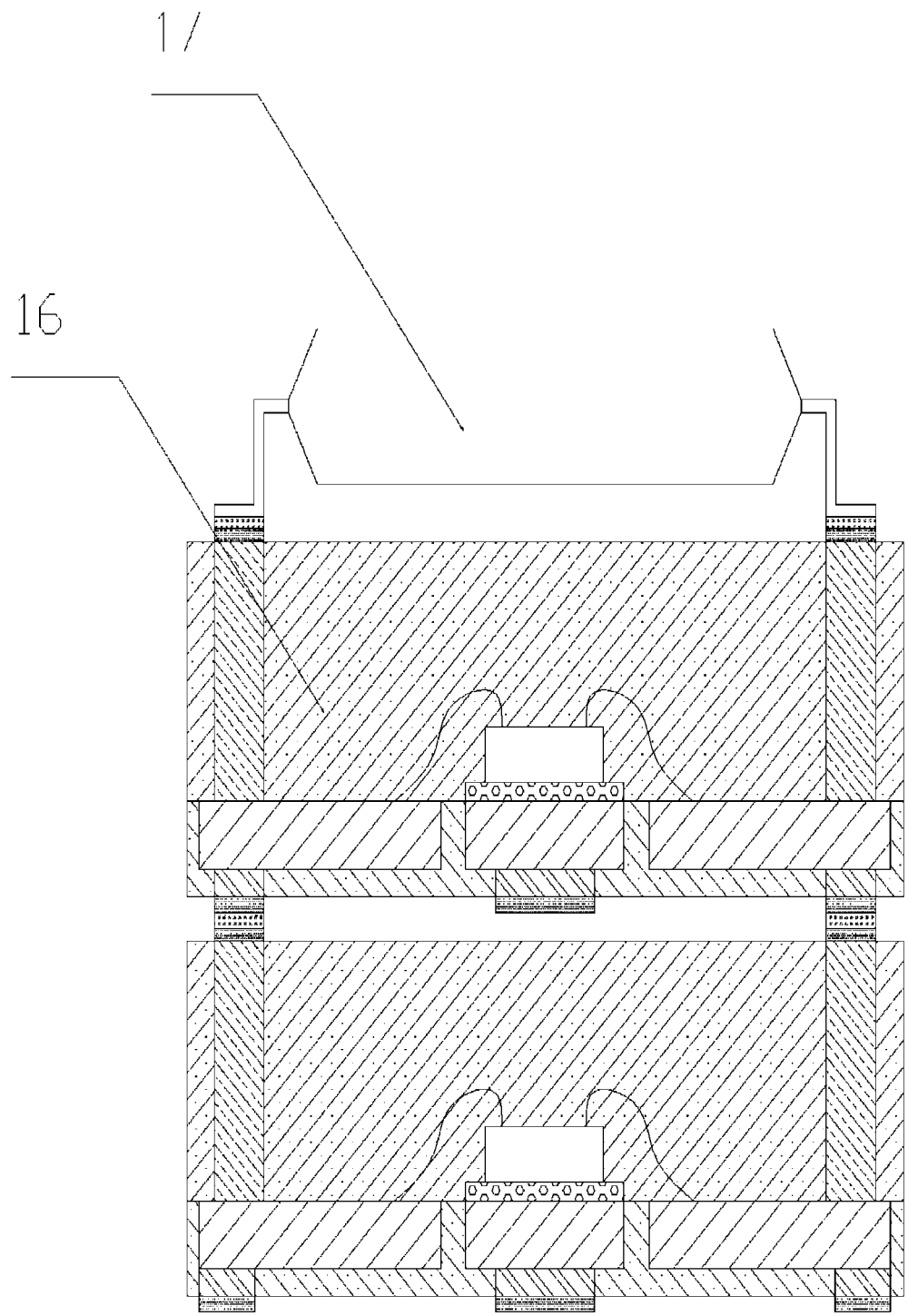
FIG. 80 is a schematic diagram of a first-etched and later-packaged three-dimensional system-in-package normal chip stack package structure according to a seventh embodiment of the present disclosure.
Figure 81:
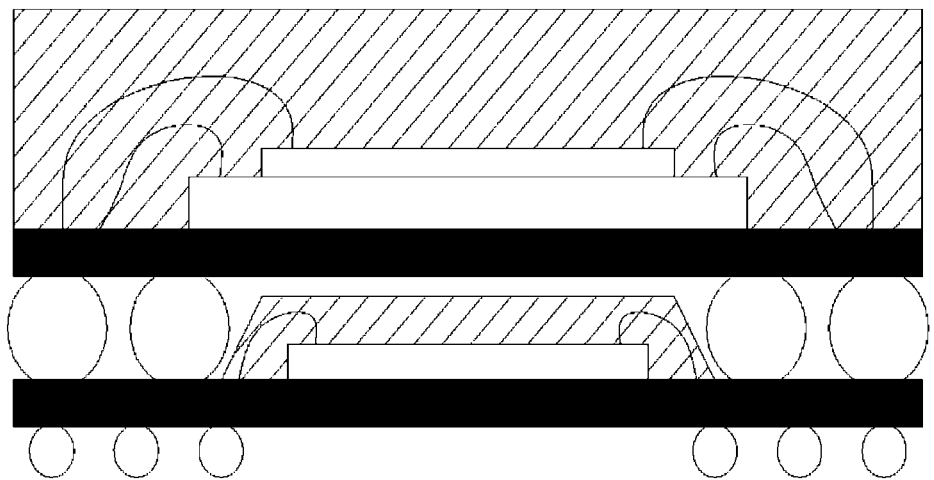
FIG. 81 is a schematic diagram of a conventional PoP (package on package) substrate package stack structure.
Figure 82:
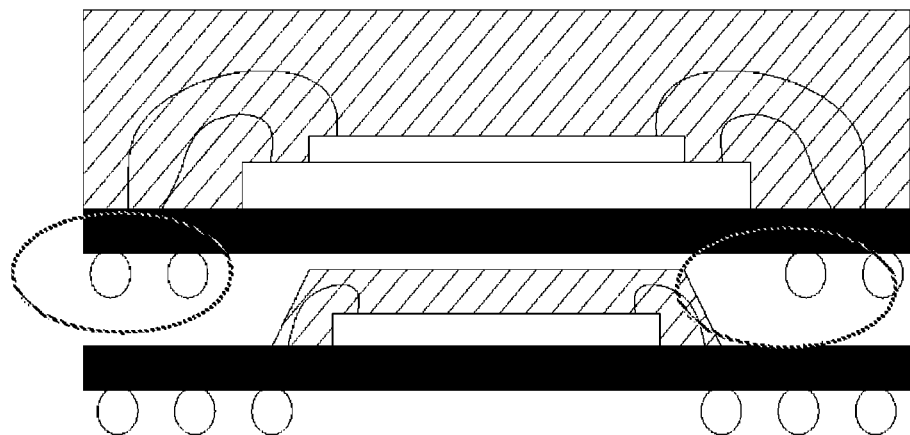
FIG. 82 is a schematic diagram of a conventional PoP (package on package) substrate package stack structure in which a solder ball height of an top package is too small to connect to a pad of the bottom package.
Figure 83:
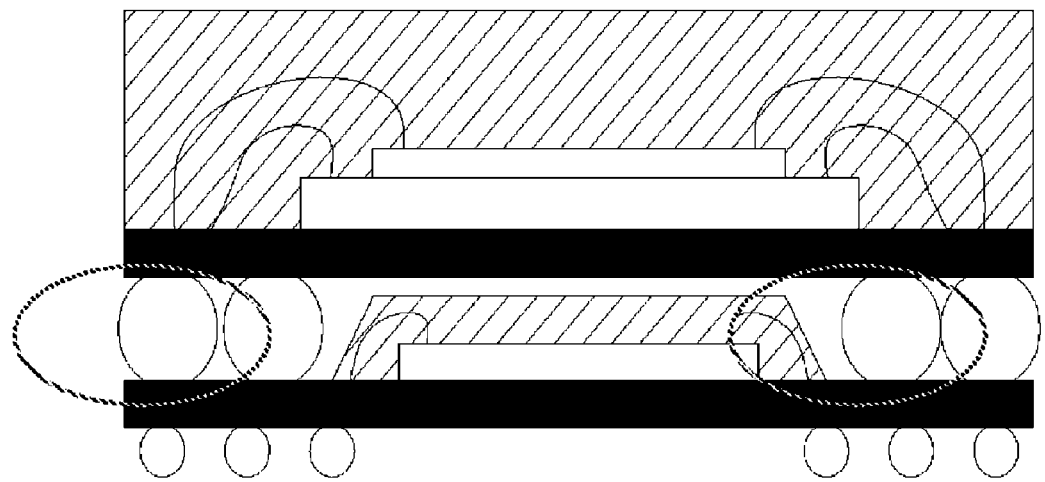
FIG. 83 is a schematic diagram of a conventional PoP (package on package) substrate package stack structure in which stacking of package with fine pitch can not be achieved since a thermal deformation occurs in a metal solder ball after reflowing.
Figure 84:
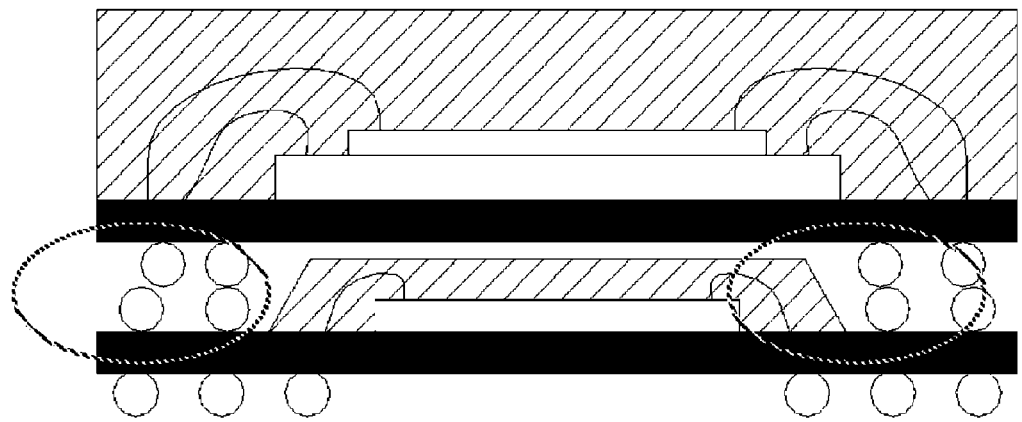
FIG. 84 is a schematic diagram of stacking a plurality of small metal solder balls in which alignment deviation occurs.
Figure 85:
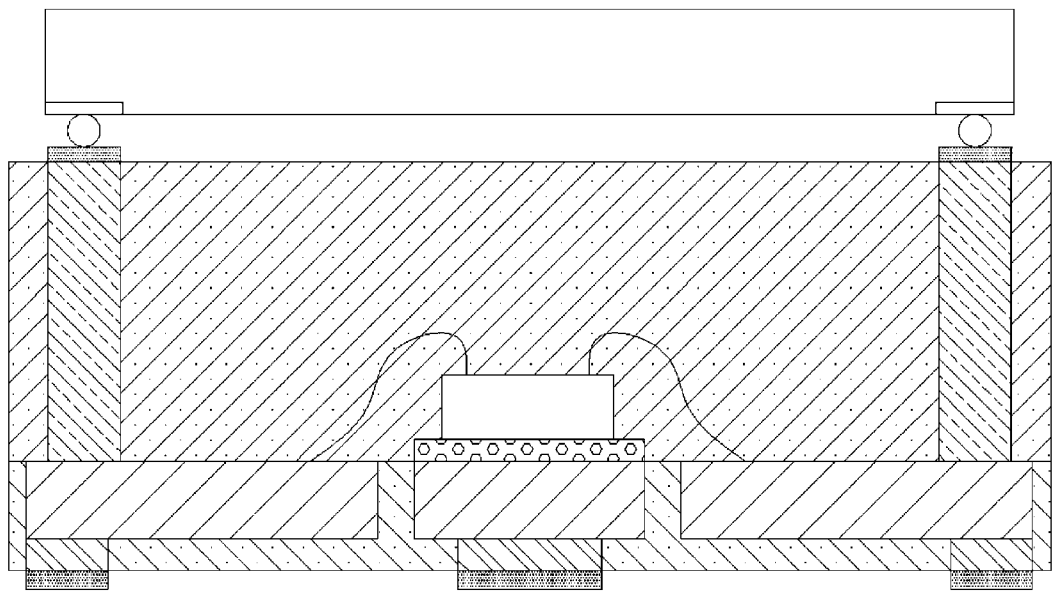
FIG. 85 is a schematic diagram of an outer lead of the top package of the present disclosure which is connected to a three-dimensional system-in-package metal wiring substrate via a small metal ball.

Three-Dimensional System-in-Package Metal Multiple-Layer Wiring Substrate Added with Stack Package Referring to FIG. 80, which is a schematic diagram of a first-etched and later-packaged three-dimensional system-in-package normal chip stack package structure according to a seventh embodiment of the present disclosure, the seventh embodiment differs from the first embodiment in that the package 9 includes a three-dimensional system-in-package metal multiple-layer wiring substrate structure 16 and a package structure 17, and the three-dimensional system-in-package metal multiple-layer wiring substrate 16 is stacked with the package structure 17. A plurality of three-dimensional system-in-package metal multiple-layer wiring substrate structures 16 may be provided, and the manner of stacking may be any one described above.

The invention claimed is:

1. A processing method for manufacturing a first-etched and later-packaged three-dimensional system-in-package normal chip stack package, comprising:
   step 1, providing a metal substrate;
   step 2, pre-plating a surface of the metal substrate with a micro copper layer;
   step 3, applying a photoresist film,
   wherein a top surface and a bottom surface of the metal substrate which have been pre-plated with the micro copper layer are applied with the photoresist film which can be exposed and developed;
   step 4, removing a part of the photoresist film on the bottom surface of the metal substrate,
   wherein the bottom surface of the metal substrate, which has been applied with the photoresist film in step 3, is exposed and developed with a pattern using an exposure and development equipment, and the part of the photoresist film in the pattern is removed, so as to expose a region of the bottom surface of the metal substrate to be plated later;
   step 5, plating with a metal wiring layer,
   wherein the region of the bottom surface of the metal substrate from which the part of the photoresist film has been removed in step 4 is plated with the metal wiring layer;

step 6, applying a photoresist film,
wherein the bottom surface of the metal substrate in step 5 is applied with the photoresist film which can be exposed and developed;
step 7, removing a part of the photoresist film on the bottom surface of the metal substrate,
wherein the bottom surface of the metal substrate, which has been applied with the photoresist film in step 6, is exposed and developed with a pattern using an exposure and development equipment, and the part of the photoresist film in the pattern is removed, so as to expose a region of the bottom surface of the metal substrate to be plated later;
step 8, plating with a high conductivity metal wiring layer,
wherein the region of the bottom surface of the metal substrate from which the part of the photoresist film has been removed in step 7 is plated with the high conductivity metal wiring layer, so that a die pad and a lead are formed;
step 9, removing the photoresist film,
wherein the photoresist film on the surface of the metal substrate is removed;
step 10, molding with epoxy resin,
wherein the molding with the epoxy resin for protecting is performed on a surface of the metal wiring layer provided on the bottom surface of the metal substrate;
step 11, grinding a surface of the epoxy resin,
wherein the surface of the epoxy resin is ground after the molding with the epoxy resin has been performed;
step 12, applying a photoresist film,
wherein the top surface and the bottom surface of the metal substrate are applied with the photoresist film which can be exposed and developed after the surface of the epoxy resin has been ground in step 11;
step 13, removing a part of the photoresist film on the top surface of the metal substrate,
wherein the top surface of the metal substrate, which has been applied with the photoresist film in step 12, is exposed and developed with a pattern using an exposure and development equipment, and the part of the photoresist film in the pattern is removed, so as to expose a region of the top surface of the metal substrate to be etched later;
step 14, chemical etching;
wherein the chemical etching is performed in the region of the top surface of the metal substrate in which exposing and developing have been performed in step 13;
step 15, applying a photoresist film,
wherein the top surface and the bottom surface of the metal substrate are applied with the photoresist film which can be exposed and developed after the chemical etching has been performed in step 14;
step 16, removing a part of the photoresist film on the top surface of the metal substrate,
wherein the top surface of the metal substrate, which has been applied with the photoresist film in step 15, is exposed and developed with a pattern using an exposure and development equipment, and the part of the photoresist film in the pattern is removed, so as to expose a region of the top surface of the metal substrate to be plated later;
step 17, plating with a metal pillar,
wherein the region of the top surface of the metal substrate from which the part of the photoresist film has been removed in step 16 is plated with the metal pillar;
step 18, removing the photoresist film,
wherein the photoresist film on the surface of the metal substrate is removed;
step 19, coating with an adhesive material;
wherein a top surface of the die pad is coated with a conductive or non-conductive adhesive material after the photoresist film on the surface of the metal substrate has been removed in step 18;
step 20, bonding dies,
wherein a chip bonded in the conductive or non-conductive adhesive material in step 19;
step 21, bonding a metal wire,
wherein the metal wire is bonded between a top surface of the chip and a top surface of the lead;
step 22, encapsulating,
wherein the molding with a molding material is performed on the top surface of the metal substrate in step 21;
step 23, grinding a surface of an epoxy resin,
wherein the surface of the epoxy resin is ground after the molding with the epoxy resin has been performed in step 22;
step 24, plating with an anti-oxidizing metal layer or coating with an organic solderability preservative,
wherein an exposed surface of the metal substrate is plated with the anti-oxidizing metal layer or is coated with the organic solderability preservative after the surface of the epoxy resin has been ground in step 23;
step 25, stacking with a package,
wherein a top of the metal pillar or a bottom surface of the lead is stacked with the package after the plating with the anti-oxidizing metal layer or the coating with the organic solderability preservative has been performed in step 24;
step 26, package sawing to form a finished product,
wherein a semi-finished product is package sawed after the stacking with the package has been performed in step 25 to form a first-etched and later-packaged three-dimensional system-in-package normal chip stack package structure.

2. A first-etched and later-packaged three-dimensional system-in-package normal chip stack package structure manufactured by the processing method according to claim 1, comprising: a die pad (1); a lead (2); a chip (4) provided on a top surface of the die pad (1) by a conductive or non-conductive adhesive material (3); a metal wire (5) via which a top surface of the chip (4) is connected to a top surface of the lead (2); a conductive pillar (6) provided on the top surface of the lead (2); a molding material (7) with which of a peripheral region of the die pad (1), a region between the die pad (1) and a lead (2), and between the leads (2), an upper region of the die pad (1) and a lead (2), a lower region of the die pad (1) and a lead (2) and the chip (4), the metal wire (5), and the conductive pillar (6) is encapsulated, with the molding material (7) being flush with a top of the conductive pillar (6), and a surface of the lead (2) and the conductive pillar (6) exposed from the molding material (7) being plated with an anti-oxidizing layer (8) or being coated with an organic solderability preservative (8); and a package (9) provided on the top of the conductive pillar (6) or on a bottom surface of the lead (2) via a conductive material (10).

3. A first-etched and later-packaged three-dimensional system-in-package normal chip stack package structure manufactured by the processing method according to claim 1, comprising: a die pad (1); a lead (2); a chip (4) provided on a top surface of the die pad (1) by a conductive or non-conductive adhesive material (3); a metal wire (5) via which a top surface of the chip (4) is connected to a top surface of the lead (2); a conductive pillar (6) provided on the top surface of the lead (2); a molding material (7) with which each of a peripheral region of the die pad (1), a region between the die pad (1) and a lead (2), and between the leads (2), an upper region of the die pad (1) and a lead (2), a lower region of the die pad (1) and a lead (2) and a peripheral region of the chip (4), the metal wire (5), and the conductive pillar (6) is encapsulated, with the molding material (7) being flush with a top of the conductive pillar (6), and a surface of the lead (2) and the conductive pillar (6) exposed from the molding material (7) being plated with an anti-oxidizing layer (8) or being coated with an organic solderability preservative (8); and a package (9) provided on the top of the conductive pillar (6) or on a bottom surface of the lead (2) via a first metal ball (14).

4. The first-etched and later-packaged three-dimensional system-in-package normal chip stack package structure according to claim 2, wherein an outer lead of the package (9) is a flat lead (11).

5. The first-etched and later-packaged three-dimensional system-in-package normal chip stack package structure according to claim 2, wherein an outer lead of the package (9) is a J-shaped lead (12).

6. The first-etched and later-packaged three-dimensional system-in-package normal chip stack package structure according to claim 2, wherein an outer lead of the package (9) is an L-shaped lead (13).

7. The first-etched and later-packaged three-dimensional system-in-package normal chip stack package structure according to claim 2, wherein a second metal ball (15) is provided on the top of the conductive pillar (6) or on the bottom surface of the lead (2).

8. The first-etched and later-packaged three-dimensional system-in-package normal chip stack package structure according to claim 2, wherein the package (9) comprises a lead frame structure (16) and a package structure (17), with the lead frame structure (16) being stacked with the package structure (17).

9. A processing method for manufacturing a first-etched and later-packaged three-dimensional system-in-package normal chip stack package, comprising:
 step 1, providing a metal substrate;
 step 2, pre-plating a surface of the metal substrate with a micro copper layer;
 step 3, applying a photoresist film,
 wherein a top surface and a bottom surface of the metal substrate which have been pre-plated with the micro copper layer are respectively applied with the photoresist film which can be exposed and developed;
 step 4, removing a part of the photoresist film on the bottom surface of the metal substrate,
 wherein the bottom surface of the metal substrate, which has been applied with the photoresist film in step 3, is exposed and developed with a pattern using an exposure and development equipment, and the part of the photoresist film in the pattern is removed, so as to expose a region of the bottom surface of the metal substrate to be plated later;
 step 5, plating with a first metal wiring layer,
 wherein the region of the bottom surface of the metal substrate from which the part of the photoresist film has been removed in step 4 is plated with the first metal wiring layer;
 step 6, applying a photoresist film,
 wherein the bottom surface of the metal substrate in step 5 is applied with the photoresist film which can be exposed and developed;
 step 7, removing a part of the photoresist film on the bottom surface of the metal substrate,
 wherein the bottom surface of the metal substrate, which has been applied with the photoresist film in step 6, is exposed and developed with a pattern using an exposure and development equipment, and the part of the photoresist film in the pattern is removed, so as to expose a region of the bottom surface of the metal substrate to be plated later;
 step 8, plating with a second metal wiring layer,
 wherein the region of the bottom surface of the metal substrate from which the part of the photoresist film has been removed in step 7 is plated with the second metal wiring layer, which serves as a conductive pillar to connect the first metal wiring layer to a third metal wiring layer;
 step 9, removing the photoresist film,
 wherein the photoresist film on the surface of the metal substrate is removed;
 step 10, applying a non-conductive adhesive film,
 wherein the bottom surface of the metal substrate is applied with a layer of the non-conductive adhesive film;
 step 11, grinding a surface of the non-conductive adhesive film,
 wherein the surface of the non-conductive adhesive film is ground after the applying the non-conductive adhesive film has been performed;
 step 12, performing metallization pretreatment on the surface of the non-conductive adhesive film,
 wherein the metallization pretreatment is performed on the surface of the non-conductive adhesive film;
 step 13, applying a photoresist film,
 wherein the top surface and the bottom surface of the metal substrate in step 12 are applied with the photoresist film which can be exposed and developed;
 step 14, removing a part of the photoresist film on the bottom surface of the metal substrate,
 wherein the bottom surface of the metal substrate, which has been applied with the photoresist film in step 13, is exposed and developed with a pattern using an exposure and development equipment, and the part of the photoresist film in the pattern is removed, so as to expose a region of the bottom surface of the metal substrate to be etched later;
 step 15, etching;
 wherein the etching is performed in a region from which the part of the photoresist film has been removed in step 14;
 step 16, removing the photoresist film on the bottom surface of the metal substrate,
 wherein the photoresist film on the bottom surface of the metal substrate is removed, so as to expose a metallized region to be plated later;
 step 17, plating with a third metal wiring layer,
 wherein the bottom surface of the metal substrate in step 16 is plated with the third metal wiring layer;
 step 18, applying a photoresist film,
 wherein the bottom surface of the metal substrate in step 17 is applied with the photoresist film which can be exposed and developed;
 step 19, removing a part of the photoresist film on the bottom surface of the metal substrate,
 wherein the bottom surface of the metal substrate, which has been applied with the photoresist film in step 18, is exposed and developed with a pattern using an exposure and development equipment, and the part of the photoresist film in the pattern is removed, so as to expose a region of the bottom surface of the metal substrate to be plated later;

step 20, plating with a fourth metal wiring layer,
wherein the region of the bottom surface of the metal substrate from which the part of the photoresist film has been removed in step 19 is plated with the fourth metal wiring layer, which serves as a conductive pillar to connect the third metal wiring layer to a fifth metal wiring layer;

step 21, removing the photoresist film,
wherein the photoresist film on the surface of the metal substrate is removed;

step 22, applying a non-conductive adhesive film,
wherein the bottom surface of the metal substrate is applied with a layer of the non-conductive adhesive film;

step 23, grinding a surface of the non-conductive adhesive film,
wherein the surface of the non-conductive adhesive film is ground after the applying the non-conductive adhesive film has been performed;

step 24, performing metallization pretreatment on the surface of the non-conductive adhesive film,
wherein the metallization pretreatment is performed on the surface of the non-conductive adhesive film;

step 25, applying a photoresist film,
wherein the top surface and the bottom surface of the metal substrate in step 24 are applied with the photoresist film which can be exposed and developed;

step 26, removing a part of the photoresist film on the bottom surface of the metal substrate,
wherein the bottom surface of the metal substrate, which has been applied with the photoresist film in step 25, is exposed and developed with a pattern using an exposure and development equipment, and the part of the photoresist film in the pattern is removed, so as to expose a region of the bottom surface of the metal substrate to be etched later;

step 27, etching;
wherein the etching is performed in a region from which the part of the photoresist film has been removed in step 26;

step 28, removing the photoresist film on the bottom surface of the metal substrate,
wherein the photoresist film on the bottom surface of the metal substrate is removed;

step 29, plating with a fifth metal wiring layer,
wherein the bottom surface of the metal substrate in step 28 is plated with the fifth metal wiring layer, so that a die pad and a lead are formed on the metal substrate;

step 30, applying a non-conductive adhesive film,
wherein the bottom surface of the metal substrate is applied with a layer of the non-conductive adhesive film;

step 31, grinding a surface of the non-conductive adhesive film,
wherein the surface of the non-conductive adhesive film is ground after the applying the non-conductive adhesive film has been performed, so as to expose a surface of the fifth metal wiring layer;

step 32, applying a photoresist film,
wherein the top surface the metal substrate in step 31 is applied with the photoresist film which can be exposed and developed;

step 33, removing a part of the photoresist film on the top surface of the metal substrate,
wherein the top surface of the metal substrate, which has been applied with the photoresist film in step 32, is exposed and developed with a pattern using an exposure and development equipment, and the part of the photoresist film in the pattern is removed, so as to expose a region of the top surface of the metal substrate to be etched later;

step 34, chemical etching;
wherein the chemical etching is performed in a region on the top surface of the metal substrate in which exposing and developing have been performed in step 33, till the metal wiring layer is reached;

step 35, applying a photoresist film,
wherein the top surface of the metal substrate on which the chemical etching has been performed in step 34 is applied with the photoresist film which can be exposed and developed;

step 36, removing a part of the photoresist film on the top surface of the metal substrate,
wherein the top surface of the metal substrate, which has been applied with the photoresist film in step 35, is exposed and developed with a pattern using an exposure and development equipment, and the part of the photoresist film in the pattern is removed, so as to expose a region of the top surface of the metal substrate to be plated later;

step 37, plating with a metal pillar,
wherein the region of the top surface of the metal substrate from which the part of the photoresist film has been removed in step 36 is plated with the metal pillar;

step 38, removing the photoresist film,
wherein the photoresist film on the surface of the metal substrate is removed;

step 39, coating with an adhesive material;
wherein a top surface of the die pad is coated with a conductive or non-conductive adhesive material after the photoresist film on the surface of the metal substrate has been removed in step 38;

step 40, bonding dies,
wherein a chip is bonded in the conductive or non-conductive adhesive material in step 39;

step 41, bonding a metal wire,
wherein the metal wire is bonded between a top surface of the chip and a top surface of the lead;

step 42, encapsulating,
wherein the molding with epoxy resin, which is commonly known as a molding material, is performed on the top surface of the metal substrate in step 41;

step 43, grinding a surface of the epoxy resin,
wherein the surface of the epoxy resin is ground after the molding with the epoxy resin has been performed in step 42;

step 44, plating with an anti-oxidizing metal layer or coating with an organic solderability preservative (OSP),
wherein an exposed surface of the metal substrate is plated with the anti-oxidizing metal layer or is coated with the organic solderability preservative (OSP) after the surface of the epoxy resin has been ground in step 43;

step 45, stacking with a package,
wherein the package is provided on a top of the metal pillar or a bottom surface of the lead after the plating with the anti-oxidizing metal layer or the coating with the organic solderability preservative has been performed in step 44;

step 46, package sawing to form a finished product,
  wherein a semi-finished product is package sawed after the stacking with the package has been performed in step 45 to form a first-etched and later-packaged three-dimensional system-in-package normal chip stack package structure.

10. The processing method for manufacturing a first-etched and later-packaged three-dimensional system-in-package normal chip stack package according to claim 9, wherein step 6 to step 17 can be repeated for times to form more metal wiring layers.

\* \* \* \* \*